United States Patent
Kurihara

(10) Patent No.: US 6,590,947 B2
(45) Date of Patent: Jul. 8, 2003

(54) CORRELATION DETECTING METHOD AND MATCHED FILTER UNIT

(75) Inventor: Naoyuki Kurihara, Yokohama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/987,103

(22) Filed: Nov. 13, 2001

(65) Prior Publication Data

US 2002/0027965 A1 Mar. 7, 2002

Related U.S. Application Data

(62) Division of application No. 09/161,519, filed on Sep. 29, 1998, now Pat. No. 6,345,077.

(30) Foreign Application Priority Data

Sep. 30, 1997 (JP) .............................. 9-265235

(51) Int. Cl.[7] .......................... H04L 27/06; H04L 27/30
(52) U.S. Cl. ........................................ 375/343; 375/152
(58) Field of Search .............................. 375/343, 152, 375/232, 235, 144, 150

(56) References Cited

U.S. PATENT DOCUMENTS

| | | | | |
|---|---|---|---|---|
| 4,651,327 A | 3/1987 | Fujita | .......................... | 375/130 |
| 5,544,167 A | 8/1996 | Lucas et al. | ................. | 375/152 |
| 5,627,855 A | 5/1997 | Davidovici | ................. | 370/342 |

FOREIGN PATENT DOCUMENTS

| | | |
|---|---|---|
| DE | 4114058 | 11/1992 |
| JP | 06090221 | 3/1994 |
| JP | 06097775 | 4/1994 |
| JP | 08111653 | 4/1996 |
| JP | 8130526 | 5/1996 |
| JP | 09046173 | 2/1997 |
| JP | 09083488 | 3/1997 |
| JP | 09200179 | 7/1997 |
| JP | 09247744 | 9/1997 |

OTHER PUBLICATIONS

Japanese Office Action dated Oct. 18, 2002.
English translation of Japanese Office Action.
Japanese Office Action dated Aug. 6, 2002.
English translation of Japanese Office Action.
European Search Report dated Jul. 7, 2001.

*Primary Examiner*—Chi Pham
*Assistant Examiner*—Khai Tran
(74) *Attorney, Agent, or Firm*—Stevens, Davis, Miller & Mosher, LLP

(57) ABSTRACT

A method and a matched filter unit comprising a plurality of computing devices, each being used for finding a value of correlation between each of a plurality of multiplexed digital input signals and digital codes strings by using a signal output from a delay circuit which is disposed in M stages. Each of the plurality of computing devices includes M multipliers for multiplying the signal output from each of the delay circuits by each digital code of the digital code string and an adder for adding results of multiplication from the M multipliers to find a value of correlation. The method and matched filter unit of the invention allows the same storage circuit to be used to detect a correlation between multiplexed digital signals entered from the plurality of channels providing a matched filter unit with a significantly reduced circuitry size resulting in a smaller size device, lowered manufacturing costs, and reduced power requirements.

6 Claims, 18 Drawing Sheets

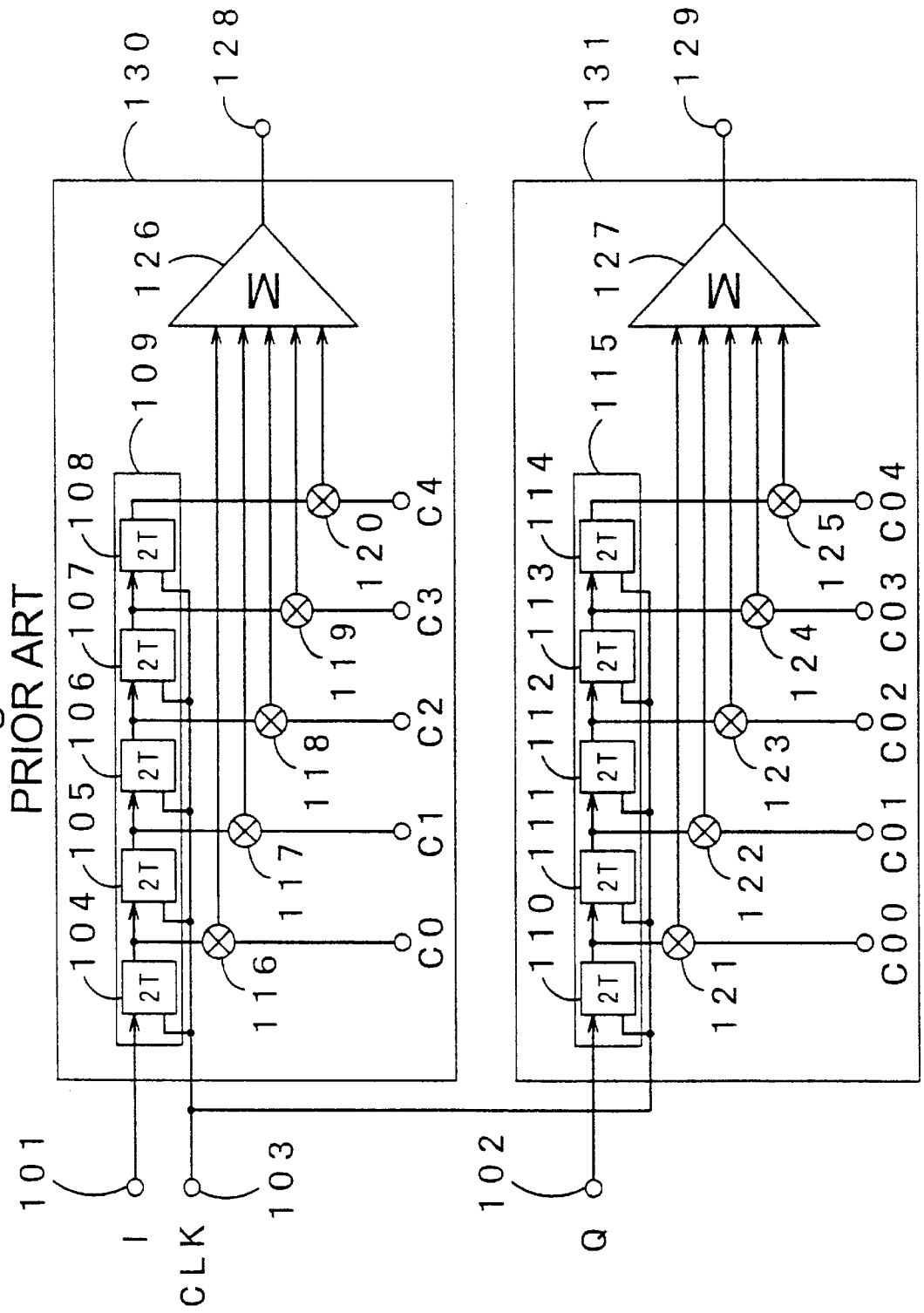

CORRELATION DETECTING METHOD AND MATCHED FILTER UNIT

This is a divisional of application Ser. No. 09/161,519 filed Sep. 29, 1998 now U.S. Pat. No. 6,345,077.

BACKGROUND OF THE INVENTION

1. Field of the Invention

The present invention relates to a method for detecting a correlation between digital signals using a spectrum communication system for pocket telephones and a matched filter unit that uses the correlation detecting method.

2. Description of the Related Art

At first, a configuration of a related art matched filter unit will be described with reference to FIG. 16. FIG. 16 shows a configuration of the first related art matched filter unit used for receiving signals from two 5-time diffusion 5-tap channels, each composed of an FIR digital filter.

This related art matched filter unit is provided with input terminals 1 and 2, a clock signal input terminal 3, a shift register 9 composed of five delay circuits 4 to 8 disposed in five stages, a shift register 15 composed of five delay circuits 10 to 14 disposed in five stages, multipliers 16 to 25, adders 26 and 27, and output terminals 28 and 29. Each of the multipliers 16 to 20 uses corresponding one of the code values in a back-diffusion code string C4C3C2C1C0 for the digital signal I. Each of the multipliers 21 to 25 uses corresponding one of the code values in a back-diffusion code string C04C03C02C01C00 for the digital signal Q.

This related art matched filter unit provides each channel with a correlation detecting circuit. Since the matched filter unit has two channels, it is provided with two matched filters 30 and 31. The matched filter 30 corresponding to the digital signal I is provided with a shift register 9 composed of five delay circuits 4 to 8 disposed in five stages, multipliers 16 to 20, and an adder 26. In the same way, the matched filter 31 corresponding to the digital signal Q is provided with a shift register 15 composed of five delay circuits 10 to 14 disposed in five stages, multipliers 21 to 25, and an adder 27.

The input terminals 1 and 2 receive the digital signals I and Q obtained by sampling analog signals (for example, spectrum diffusion signals) with a 4.096 MHz sampling frequency. The digital signals I and Q are synchronized with a 4.096 MHz clock signal CLK entered to the clock signal input terminal. The digital signal I is entered to the first delay circuit 4 of the shift register 9, then shifted from the first delay circuit 4 to the fifth delay circuit 8 sequentially in synchronization with the clock signal CLK. In the same way, the digital signal Q is entered to the first delay circuit 10 of the shift register 15, then shifted from the first delay circuit 10 to the fifth delay circuit 14 sequentially in synchronization with the clock signal CLK.

The multiplier 16 multiplies a signal output from the first delay circuit 4 of the shift register 9 by the back-diffusion code value C0 of the back-diffusion code string C4C3C2C1C0. Each of the multipliers 17 to 20 multiplies a signal output from corresponding one of the delay circuits 5 to 8 by corresponding one of the back-diffusion code values C1 to C4. Each of the multipliers 21 to 25 multiplies a signal output from corresponding one of the delay circuits 10 to 14 by corresponding one of the back-diffusion code values C00 to C04.

The adder 26 receives and adds the result of multiplication performed in each of the multipliers 16 to 20, while the adder 27 receives and adds the result of multiplication performed in each of the multipliers 21 to 25. Consequently, a value of the correlation with the entered digital signal I is output to the output terminal 28 and a value of correlation with the entered digital signal Q is output to the output terminal 29.

Next, description will be made for a procedure of multiplication performed in each of the multipliers 16 to 25, as well as a procedure of back-diffusion computing performed in each of the adders 26 and 27 with reference to the timing chart shown in FIG. 17.

In the initial state, all the signals output from the delay circuits 4 to 8 and 10 to 14 composing the shift registers 9 and 15 respectively are set in the low level.

At first, in the first operation state of the matched filter 30, the first sampling data D0 of the digital signal I is entered to the input terminal 1 synchronously with the clock signal CLK, then fetched into the first delay circuit 4. The multiplier 16 multiplies this sampling data D0 by the back-diffusion code value C0. Consequently, the multiplier 16 outputs a signal indicating the value D0×C0.

In the second operation state, the second sampling data D1 of the digital signal I is entered to the input terminal 1 synchronously with the clock signal CLK, then fetched into the first delay circuit 4. At the same time, the first sampling data D0 is fetched into the second delay circuit 5. Consequently, the multiplier 16 multiplies the second sampling data D1 by the back-diffusion code value C0 and the multiplier 17 multiplies the first sampling data D0 by the back-diffusion code value C1. The multiplier 16 thus outputs a signal indicating the value D1×C0 and the multiplier 17 outputs a signal indicating the value D0×C1. Hereafter, the same processings are repeated until the fourth sampling data D3 is entered to the input terminal 1.

After this, if the fifth sampling data D4 of the digital signal I is entered to the input terminal 1 synchronously with the clock signal CLK entered to the clock signal input terminal 3, the first to fifth sampling data D0 to D4 are fetched into the delay circuits 4 to 8 respectively. Consequently, the multiplier 16 outputs the result of multiplication indicating the value D4×C0 and the multiplier 17 outputs the result of multiplication indicating the value D3×C1. And, the multiplier 18 outputs the result of multiplication indicating the value D2×C2, the multiplier 19 outputs the result of multiplication indicating the value D1×C3, and the multiplier 20 outputs the result of multiplication indicating the value D0×C4. This completes all the necessary processings for finding a correlation value between the back-diffusion code string C4C3C2C1C0 and the first five sampling data D0 to D4 of the digital signal I. The adder 26 adds the multiplication result from each of the multipliers 16 to 20 and outputs the correlation result H (4) from the output terminal 28.

The same processings are also performed in the matched filter 31. The first five sampling data D00 to D04 of the digital signal Q are entered to the input terminal 2. Each of the multipliers 21 to 25, as well as the adder 27 performs a back-diffusion computing processing with respect to the back-diffusion code string C04C03C02C01C00 and the correlation result H (04) is output from the output terminal 29. Hereafter, the same processings are repeated.

Next, description will be made for another related art matched filter unit used when a received signal is oversampled.

When a receiving timing of a received signal is detected by detecting the correlation with the received signal for a pocket telephone, the received signal is usually oversampled by m times with respect to the chip rate frequency, then it is entered to a matched filter unit. This is to improve the accuracy of detecting the receiving timing.

FIG. 18 is a configuration of the second related art 5-time diffusion 10-tap matched filter unit composed of FIR digital filters.

This related art matched filter unit is provided with input terminals 101 and 102, a clock signal input terminal 103, a shift register 109 composed of delay circuits 104 to 108 disposed in five stages, a shift register 115 composed of delay circuits 110 to 114 disposed in 10 stages, multipliers 116 to 125, adders 126 and 127, and output terminals 128 and 129. Each of the multipliers 116 to 120 uses corresponding one of the code values of the back-diffusion code string C4C3C2C1C0 for the digital signal I, while each of the multipliers 121 to 125 uses corresponding one of the code values of the back-diffusion code string C04C03C02C01C00 for the digital signal Q.

Just like the first related matched filter unit, this second related art matched filter unit provides each channel with one correlation detecting circuit. Since this related art second matched filter unit has two channels, it is provided with two matched filters 130 and 131.

To the input terminals 101 and 102 are entered digital signals I and Q generated by sampling analog signals (for example, spectrum diffusion signals) with a 8.192 MHz sampling frequency (double the sample frequency in the above one). The digital signals I and Q are synchronized with the 8.192 MHz clock signal CLK entered to the clock signal input terminal 103. The digital signal I is entered to the first delay circuit 104 of the shift register 109, then shifted from the first delay circuit 104 to the fifth delay circuit 108 sequentially in synchronization with the clock signal CLK. Each of the delay circuits 104 to 108 is a two-stage delay circuit in this embodiment. Each delay circuit takes about 2 clocks to shift signal data to the next delay circuit. In the same way, the digital signal Q is entered to the first delay circuit 110 of the shift register 115, then shifted from the first delay circuit 110 to the fifth delay circuit 114 sequentially in synchronization with the clock signal CLK.

The multiplier 116 multiplies a signal output from the first delay circuit of the shift register 109 by the back-diffusion code value C0 of the back-diffusion code string C4C3C2C1C0. Each of the multipliers 117 to 120 multiplies a signal output from each of the delay circuits 105 to 108 by corresponding one of the back-diffusion code values C1 to C4. Each of the multipliers 121 to 125 multiplies a signal output from each of the delay circuits 110 to 114 by corresponding one of the back-diffusion code values C00 to C04.

The adder 126 receives and adds results of multiplication from the multipliers 116 to 120, while the adder 127 receives and adds results of multiplication from the multipliers 121 to 125. Consequently, a value of correlation with respect to the entered digital signal I is output to the output terminal 128 and a value of correlation with respect to the entered digital signal Q is output to the output terminal 129.

Furthermore, since such a value of correlation with respect to each of the digital signals I and Q is obtained in the matched filter unit shown in FIG. 8 each time a 8.196 MHz clock CLK is entered to the clock signal input terminal 103, the matched filter unit shown in FIG. 18 can obtain a value of correlation at a ½ time interval of that of the matched filter unit shown in FIG. 16.

In the configurations of the first and second related art matched filter units described above, however, each channel needs a matched filter. When the spectrum communication method for pocket telephones is adopted, therefore, a matched filter is needed for each of the two channels (same phase channel and orthogonal channel). In addition, if the object matched filter unit has a space diversity, a matched filter is needed for each of the four channels in total. And, this makes it expand the circuitry size of the matched filter unit. This is why the related art matched filter units described above have suffered from a problem that it is difficult to satisfy the miniaturizing, lower manufacturing cost, and power saving prerequisites.

SUMMARY OF THE INVENTION

Under such the circumstances, it is an object of the present invention to provide a correlation detecting method and a matched filter unit that uses the correlation detecting method, which can solve the above related art problems and can be reduced significantly in circuitry size thereby to satisfy the miniaturizing, lower manufacturing cost, and power saving prerequisites for detecting a correlation between diffusion-modulated digital signals entered from a plurality of channels.

The correlation detecting method of the present invention is used to find a value of correlation between each of a plurality of digital signals and each of a plurality of digital code strings. The correlation detecting method includes a process for multiplexing a plurality of the digital signals, a process for storing each of multiplexed signals, and a process for a back-diffusion computing processing of each of those stored multiplexed signals and a plurality of the digital code strings.

According to the present invention, therefore, a plurality of digital signals that are diffusion-modulated with different code values are not correlative with each other and those non-correlative digital signals are multiplexed and stored. Then, each of the stored multiplexed signals is computed for back-diffusion using each of a plurality of the digital code strings, so that the same storage circuit can be used to detect a correlation between digital signals (both I and Q) entered from a plurality of channels. This is why it is possible to provide a matched filter unit that can be reduced significantly in circuitry size thereby to satisfy the miniaturizing, lower manufacturing cost, and power saving prerequisites.

The matched filter unit of the present invention is used to find a value of correlation between each of a plurality of digital signals synchronized with a clock and each of a plurality of digital code strings consisting of M (M: plural) digital codes respectively. The matched filter unit comprises a circuit for multiplexing a plurality of digital signals, a storage circuit composed of delay circuits disposed in M (M: plural) stages and used for entering a signal from the signal multiplexing circuit to the first stage delay circuit, then shifting the signal to the subsequent delay circuits sequentially in synchronization with the clock, and a plurality of computing devices used respectively for finding a value of correlation between each of a plurality of the digital signals and a digital code string using a signal output from corresponding one of the delay circuits disposed in M stages. Each of the computing devices is provided with M (M: plural) multipliers, each used for multiplying a signal output from the corresponding delay circuit by each digital code of a digital code string, and an adder for adding results of multiplication from the M multipliers to find a value of correlation.

Furthermore, the matched filter unit of the present invention is also used to find a value of correlation between each of a plurality of digital signals over-sampled with the second clock having a frequency m times that of the first clock and each of a plurality of digital code strings consisting of M (M: plural) digital codes respectively. The matched filter unit comprises a circuit for multiplexing a plurality of digital signals, a storage circuit composed of delay circuits disposed in m×M stages and used for entering a signal output from the signal multiplexing circuit to the first stage delay circuit, then shifting the signal to the subsequent delay circuits sequentially in synchronization with the second clock, and a plurality of computing devices used respectively for finding a value of correlation between each of a plurality of the digital signals and a digital code string using a signal output from each m-th stage delay circuit of the delay circuits disposed in m×M stages. Each of the computing devices comprises M (M: plural) multipliers used respectively for multiplying a signal output from each m-th stage delay circuit and each digital code of a digital code string, and an adder for adding results of multiplication from the M multipliers to find a value of correlation.

According to those inventions, a plurality of digital signals that are diffusion-modulated with different code values are not correlative with each other and those non-correlative digital signals are multiplexed. Then, each multiplexed signal is computed for back-diffusion in the storage circuit, the multiplier, and the adder using a digital code string different from those of other multiplexed signals, so that the same storage circuit can be used to detect a correlation between digital signals (both I and Q) entered from a plurality of channels. This is why the present invention can provide a matched filter unit that can be reduced significantly in circuitry size thereby to satisfy the miniaturizing, lower manufacturing cost, and power saving prerequisites.

The correlation detecting method of the present invention is used to find a value of correlation between each of a plurality of digital signals and each of a plurality of digital code strings. The correlation detecting method includes a process for multiplexing a plurality of digital signals, a process for storing each of multiplexed signals, a process for switching a plurality of digital code strings in a time-dividing manner, and a process for performing a back-diffusion computing processing for each of the stored multiplexed signals and the digital code strings switched in a time-dividing manner.

According to the present invention, a plurality of digital signals that are diffusion-modulated with different code values are not correlative with each other and those non-correlative digital signals are multiplexed and stored. And, each of those stored multiplexed signals is computed for back-diffusion in time-dividing manner, so that the same storage circuit and the same back-diffusion computing device can be used to detect a value of correlation between digital signals (both I and Q) entered from a plurality of channels. Consequently, the present invention can provide a matched filter unit that can be reduced significantly in circuitry size thereby to satisfy the miniaturizing, lower manufacturing cost, and power saving prerequisites.

The matched filter unit of the present invention is used to find a value of correlation between each of a plurality of digital signals synchronized with a clock and each of a plurality of digital code strings consisting of M (M: plural) digital codes respectively. The matched filter unit comprises a circuit for multiplexing a plurality of digital signals, a storage circuit composed of delay circuits disposed in M (M: plural) stages and used for entering a signal from the signal multiplexing circuit to the first stage delay circuit, then shifting the signal to the subsequent delay circuits sequen-tially in synchronization with the clock, a circuit for switching a plurality of digital code strings to output in a time-dividing manner, M (plural) multipliers used respectively for multiplying a signal output from each delay circuit by each digital code of a digital code string output from the digital code string switching circuit, and an adder for adding results of multiplication from the M multipliers to find a value of correlation.

Furthermore, the matched filter unit of the present invention is also used to find a value of correlation between each of a plurality of digital signals over-sampled with the second clock having a frequency m times that of the first clock and each of a plurality of digital code strings consisting of M (M: plural) digital codes respectively. The matched filter unit comprises a circuit for multiplexing a plurality of digital signals, a storage circuit composed of delay circuits disposed in m×M stages and used for entering a signal output from the signal multiplexing circuit to the first stage delay circuit, then shifting the signal to the subsequent delay circuits sequentially in synchronization with the second clock, a circuit for switching a plurality of digital code strings to output in a time-dividing manner, and M (M: plural) multipliers used respectively for multiplying a signal output from each m-th stage delay circuit of the delay circuits disposed in m×M stages, and an adder for adding results of multiplication from the M multipliers to find a value of correlation.

According to those inventions, a plurality of digital signals that are diffusion-modulated with different code values are not correlative with each other and those non-correlative digital signals are multiplexed. Then, each multiplexed signal is computed for back-diffusion in the same storage circuit, the same multiplier, and the same adder in a time-dividing manner using a digital code string switched in a time-dividing manner in the digital code string switching circuit, so that the same storage circuit, the same multiplier, and the same adder can be used to detect a correlation between digital signals (both I and Q) entered from a plurality of channels. This is why the present invention can provide a matched filter unit that can be reduced significantly in circuitry size thereby to satisfy the miniaturizing, lower manufacturing cost, and power saving prerequisites.

The correlation detecting method of the present invention is used to find a value of correlation between each of a plurality of digital signals and each of a plurality of digital code strings. The correlation detecting method includes a process for changing a phase of a plurality of digital signals, a process for multiplexing a plurality of the digital signals including those whose phase is changed, a process for storing each of multiplexed signals, a process for performing a back-diffusion computing processing for each of the stored multiplexed signals and a plurality of the digital code strings.

According to the present invention, a phase of a plurality of digital signals that are diffusion-modulated with the same code value is changed thereby to eliminate each correlation between a plurality of the digital signals, then those non-correlative digital signals are multiplexed and stored. After this, each of the stored multiplexed signals is computed for back-diffusion, so that the same storage circuit and the same back-diffusion computing device are used to detect each correlation between a plurality of the digital signals. This is why the present invention can provide a matched filter unit that can be reduced significantly in circuitry size to satisfy the miniaturizing, lower manufacturing cost, and power saving prerequisites.

The matched filter unit of the present invention is used to find a value of correlation between each of a plurality of digital signals synchronized with a clock and a digital code string consisting M (M: plural) digital codes respectively. The matched filter unit comprises a circuit for changing a phase of a plurality of digital signals, a circuit for multiplexing a plurality of the digital signals including those whose phase is changed, a storage circuit composed of delay circuits disposed in M (M: plural) stages and used for entering a signal from the signal multiplexing circuit to the first stage delay circuit, then shifting the signal to the subsequent delay circuits sequentially in synchronization with the clock, M (plural) multipliers used respectively for multiplying a signal output from each delay circuit by each digital code of a digital code string output from the digital code string switching circuit, and an adder for adding results of multiplication from the M multipliers to find a value of correlation.

Furthermore, the matched filter unit of the present invention is also used to find a value of correlation between each of a plurality of digital signals over-sampled with the second clock having a frequency m times that of the first clock and each of a plurality of digital code strings consisting of M (M: plural) digital codes respectively. The matched filter unit comprises a circuit for changing a phase of a plurality of digital signals, a circuit for multiplexing a plurality of the digital signals including those whose phase is changed, a storage circuit composed of delay circuits disposed in m×M stages and used for entering a signal output from the signal multiplexing circuit to the first stage delay circuit, then shifting the signal to the subsequent delay circuits sequentially in synchronization with the second clock, M (M: plural) multipliers used respectively for multiplying a signal output from each m-th stage delay circuit of the delay circuits disposed in m×M stages, and an adder for adding results of multiplication from the M multipliers to find a value of correlation.

According to those inventions, a phase of a plurality of digital signals that are diffusion-modulated with the same code value is changed thereby to eliminate each correlation between those digital signals, then those digital signals are multiplexed. After this, each of multiplexed signals is computed for back-diffusion in the storage circuit, the computing device, and the adder using a digital code string, so that the multiplexed signal is computed for back-diffusion in the storage circuit, the multiplier, and the adder using a digital code string, so that the same storage circuit, the same multiplier, and the same adder can be used to detect a correlation between digital signals (both I and Q) entered from a plurality of channels. This is why the present invention can provide a matched filter unit that can be reduced significantly in circuitry size thereby to satisfy the miniaturizing, lower manufacturing cost, and power saving prerequisites.

BRIEF DESCRIPTION OF THE DRAWINGS

FIG. 18 is a block diagram for the matched filter unit in the second related art embodiment.

DETAILED DESCRIPTION OF PREFEERED EMBODIMENTS

[First Embodiment]

At first, the first embodiment of the present invention will be described with reference to the accompanying drawings.

Figure 1:
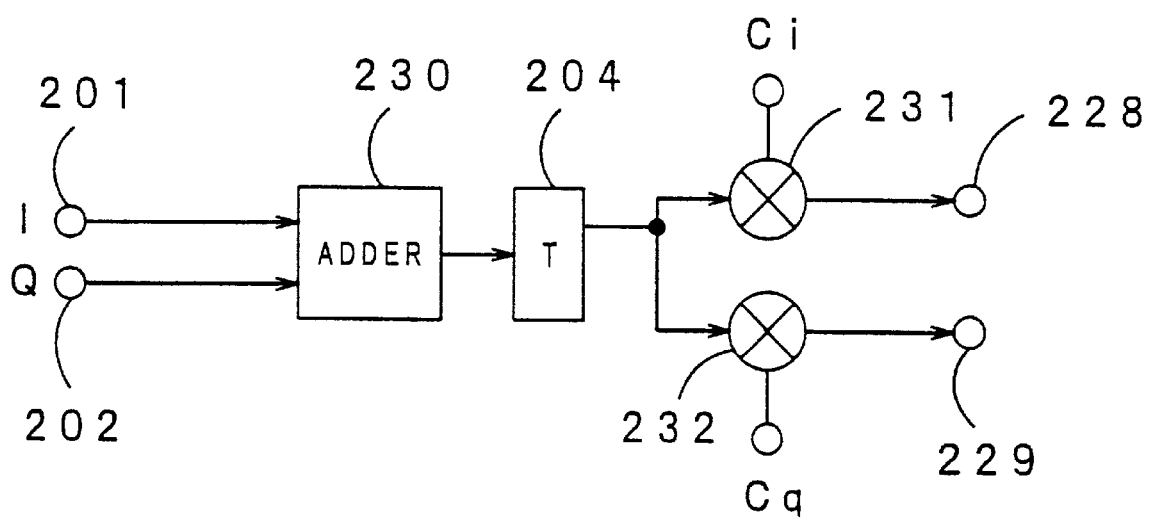
FIG. 1 indicates a concept of the correlation detecting method in the first embodiment of the present invention.

FIG. 1 indicates a conception of the correlation detecting method in the first embodiment of the present invention. In FIG. 1, 201 and 202 are input terminals, 204 is a storage circuit, 230 is a signal multiplexing circuit composed of an adder, 231 and 232 are back-diffusion computing devices, 228 and 229 are output terminals, Ci is a code value for performing back-diffusion of the digital signal I, and Cq is a code value for performing back-diffusion of the digital signal Q.

The correlation detecting method in this embodiment is characterized by that the digital signals I and Q are diffusion-modulated with different code values, then the modulated signals are multiplexed and stored. After this, each stored multiplexed signal is computed for back-diffusion according to the code value Ci or Cq.

As shown in FIG. 1, at first diffusion-modulated digital signals I and Q are entered to the input terminals 201 and 202 respectively. The digital signals I and Q are not correlative with each other. Then, the signal multiplexing circuit 230 multiplexes the signals I and Q and outputs the result to the storage circuit 204. The back-diffusion computing device 231 then computes the digital signal I entered from the storage circuit 204 for back-diffusion according to the code value Ci, while the back-diffusion computing device 232 computes the digital signal Q entered from the storage circuit 204 according to the code value Cq. Consequently, from the output terminal 228 is output a correlation value for the digital signal I entered from the input terminal 201. And, from the output terminal 229 is output a correlation value for the digital signal Q entered from the input terminal 202.

According to such the first embodiment of the present invention, the digital signals I and Q that are diffusion-modulated with different code values are not correlative with each other. Those non-correlative signals are then multiplexed and stored in the storage circuit 204 used to store multiplexed signals. And, since a back-diffusion computing processing is performed for each of the multiplexed signals I and Q according to the code values Ci or Cq, therefore, it is possible to use the same storage circuit 204 to detect the correlation between the digital signals I and Q. Consequently, it is possible to provide a matched filter unit that can be reduced in circuitry size significantly to satisfy the miniaturizing, lower manufacturing cost, and power saving prerequisites.

Although only two digital signals I and Q are used in this first embodiment, it is also possible to use more signals that are diffusion-modulated with different code values and entered from three or more channels in the same configuration.

[Second Embodiment]

Hereunder, the second embodiment of the present invention will be described with reference to the accompanying drawings.

Figure 2:
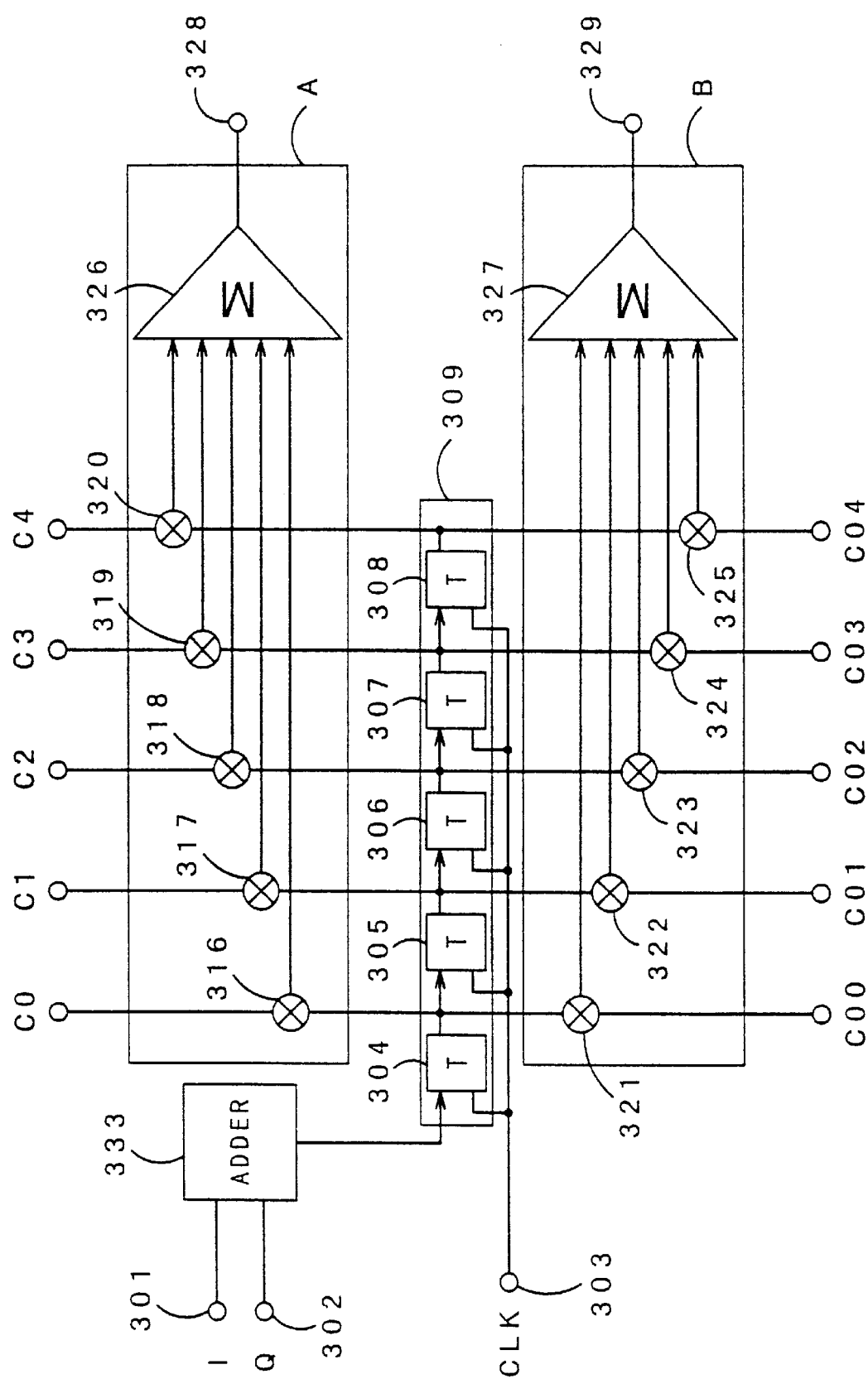
FIG. 2 is a block diagram for the matched filter unit in the second embodiment of the present invention.

FIG. 2 is a configuration of the matched filter unit in the second embodiment of the present invention.

The matched filter unit in this second embodiment is a five-time diffusion five-tap one used to perform the correlation detecting method in the first embodiment. The matched filter unit, as shown in FIG. 2, comprises input terminals 301 and 302, a clock signal input terminal 303, a shift register (storage circuit) composed of delay circuits 304 to 308 disposed in 5 stages, multipliers 316 to 325, adders 326 and 327, output terminals 328 and 329, and a signal multiplexing circuit 333 composed of an adder. Each of the multipliers 316 to 320 of this matched filter unit uses corresponding one of the code values of the back-diffusion code string (digital code string) C4C3C2C1C0 for the digital signal I. The multipliers 316 to 320 and the adder 326 are combined to compose a computing device A used for back-diffusion computing processing of the digital signal I. On the other hand, each of the multipliers 321 to 325 uses corresponding one of the code values of the back-diffusion code string (digital code string) C04C03C02C01C00 for the digital signal Q. The multipliers 321 to 325 and the adder 327 are combined to compose a computing device B used for back-diffusion computing processing of the digital signal Q.

The input terminals 301 and 302 receive digital signals I and Q generated by sampling analog signals (for example, spectrum diffusion signals) with a 4.096 MHz sampling frequency. The digital signals I and Q are synchronized to the 4.096 MHz clock signal CLK entered to the clock signal input terminal 303.

And, if digital signals I and Q are entered to the input terminals 301 and 302 respectively, the multiplexing circuit 333 multiplexes the signals I and Q. The multiplexed signal is then entered to the first delay circuit 304 of the shift register 309. After this, the multiplexed signal, synchronized to the clock signal CLK, is shifted from the first delay circuit 304 to the fifth stage delay circuit 308 sequentially. The multiplier 316 then multiplies the signal output from the first delay circuit 304 of the shift register 309 by the code value C0, thereby the digital signal I is back-diffused. In the same way, each of the multipliers 317 to 320 multiplies the signal entered from each of the delay circuits 305 to 308 by corresponding one of the code values C1 to C4, thereby the digital signal I is back-diffused. The multiplier 321 multiplies the signal output from the first delay circuit 304 of the shift register 309 by the code value C00, thereby the digital signal Q is back-diffused. In the same way, each of the multipliers 322 to 325 multiplies the signal entered from each of the delay circuits 305 to 308 by corresponding one of the code values C01 to C04, thereby the digital signal Q is back-diffused.

The adder 326 adds the result of multiplication entered from each of the multipliers 316 to 320. The adder 327 adds the result of multiplication entered from each of the multipliers 321 to 325. Consequently, from the output terminals 328 and 329 are output correlation values with respect to the digital signals I and Q respectively.

Figure 3:
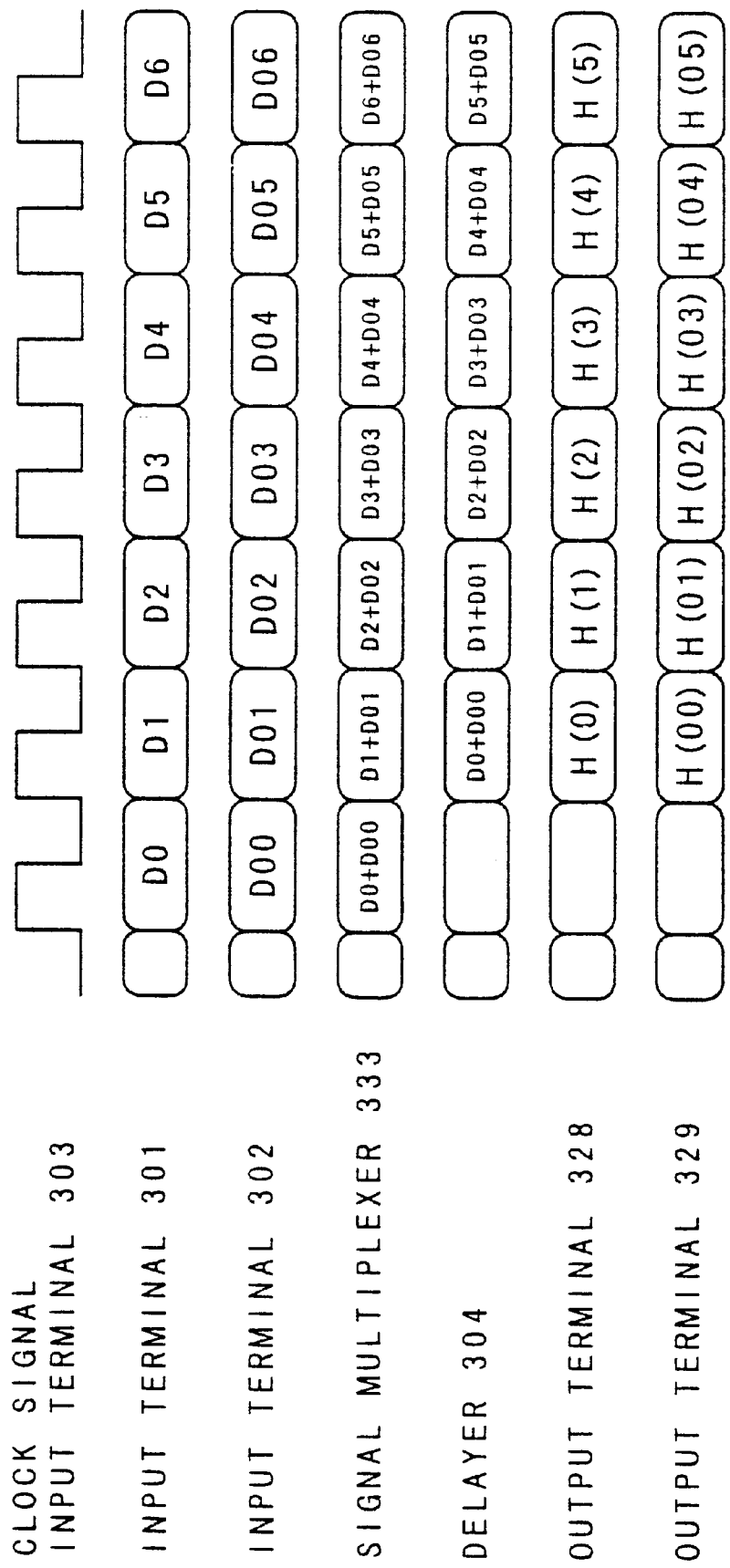
FIG. 3 is a timing chart for the matched filter unit in the second embodiment of the present invention.

Hereunder, description will be made for a procedure of a back-diffusion computing processing performed in each of the multipliers 316 to 325, as well as in the adders 326 and 327 with reference to the timing chart shown in FIG. 3.

In the initial state, all the signals output from the delay circuits 304 to 308 composing the shift register 309 are set in the low level.

In the first operation state, if the first sampling data D0 and D00 of the digital signal I and Q are entered to the input terminals 302 and 302 respectively in synchronization with the clock signal CLK, the signal multiplexing circuit 333 multiplexes the data D0 and D00, then the multiplexed signal is fetched into the first delay circuit 304. After this, the multiplier 316 multiplies the signal output from the delay circuit 304 by the code value C0. Consequently, the multiplier 316 outputs a signal indicating the value (D0+D00)×C0. The same processing is also performed in the multiplier 321, thereby the multiplier 321 outputs a signal indicating the value (D0+D00)×C00.

In the second operation state, if the second sampling data D1 and D01 of the digital signal I and Q are entered to the input terminals 301 and 302 respectively in synchronization with the clock signal CLK, the signal multiplier 333 multiplexes the data D1 and D01, then the multiplexed signal is fetched into the first delay circuit 304. At the same time, the multiplexed signal D0+D00 of both first sampling data is fetched into the second delay circuit 305. Consequently, the multiplier 316 multiplies the signal output from the delay circuit 304 by the code value C0 and the multiplier 317 multiplies the signal output from the delay circuit 305 by the code value C1. The multiplier 316 thus outputs a signal indicating the value (D1+D01)×C0 and the multiplier 317 outputs a signal indicating the value (D0+D00)×C1. The same processing is also performed in the multipliers 321 and 322, thereby the multiplier 321 outputs a signal indicating the value (D1+D01)×C00 and the multiplier 322 outputs a signal indicating the value (D0+D00)×C01.

Hereafter, the same processings are repeated until the fourth sampling data D3 and D03 are entered to the input terminals 301 and 302.

And, if the fifth sampling data D4 and D04 of the digital signals I and Q are entered to the input terminals 301 and 302 respectively in synchronization with the clock signal CLK, each of the multiplexed signals of the first to fifth sampling data D0 to D4 and D00 to D04 are fetched into the delay circuits 304 to 308 respectively. Consequently, the multiplier 316 outputs a multiplication result indicating the values (D4+D04)×C0, the multiplier 317 outputs a multiplication result indicating the value (D3+D03)×C1, the multiplier 318 outputs a multiplication result indicating the value (D2+D02)×C2, the multiplier 319 outputs a multiplication result indicating the value (D1+D01)×C1, the multiplier 320 outputs a multiplication result indicating the value (D0+D00)×C0, the multiplier 321 outputs a multiplication result indicating the value (D4+D04)×C00, the multiplier 322 outputs a multiplication result indicating the value (D3+D03)×C0, the multiplier 323 outputs a multiplication result indicating the value (D2+D02)×C02, the multiplier 324 outputs a multiplication result indicating the value (D1+D01)×C03, and the multiplier 325 outputs a multiplication result indicating the value (D0+D00)×C04 respectively.

This completes all the necessary multiplications for finding a value of correlation between the back-diffusion code string C4C3C2C1C0 and the first five sampling data D0 to D4 of the digital signal I, as well as a value of correlation between the back-diffusion code string C04C03C02C01C00 and the first five sampling data D00 to D04 of the digital signal Q, thereby the result of multiplication in each multiplier is added in each of the adders 326 and 327 and input correlation results H(4) and H(04) are output from the output terminals 328 and 329 with respect to the digital signals I and Q.

According to such the second embodiment of the present invention, the digital signals I and Q that are diffusion-modulated with different code values are not correlative with each other. Those non-correlative signals are then multiplexed and this multiplexed signal is computed for back-diffusion using a back-diffusion code string for each of the digital signals I and Q respectively. Thus, such a back-diffusion computing processing can be performed for two digital signals I and Q using the same delay circuits 304 to 308, thereby to reduce the circuitry size of the matched filter unit significantly to satisfy the miniaturizing, lower manufacturing cost, and power saving prerequisites.

Furthermore, although only two input digital signals I and Q are used in this second embodiment, it is also possible to use more signals that are diffusion-modulated with different code values and entered from three or more channels in the same configuration.

[Third Embodiment]

Hereunder, the third embodiment of the present invention will be described with reference to the accompanying drawings.

Figure 4:
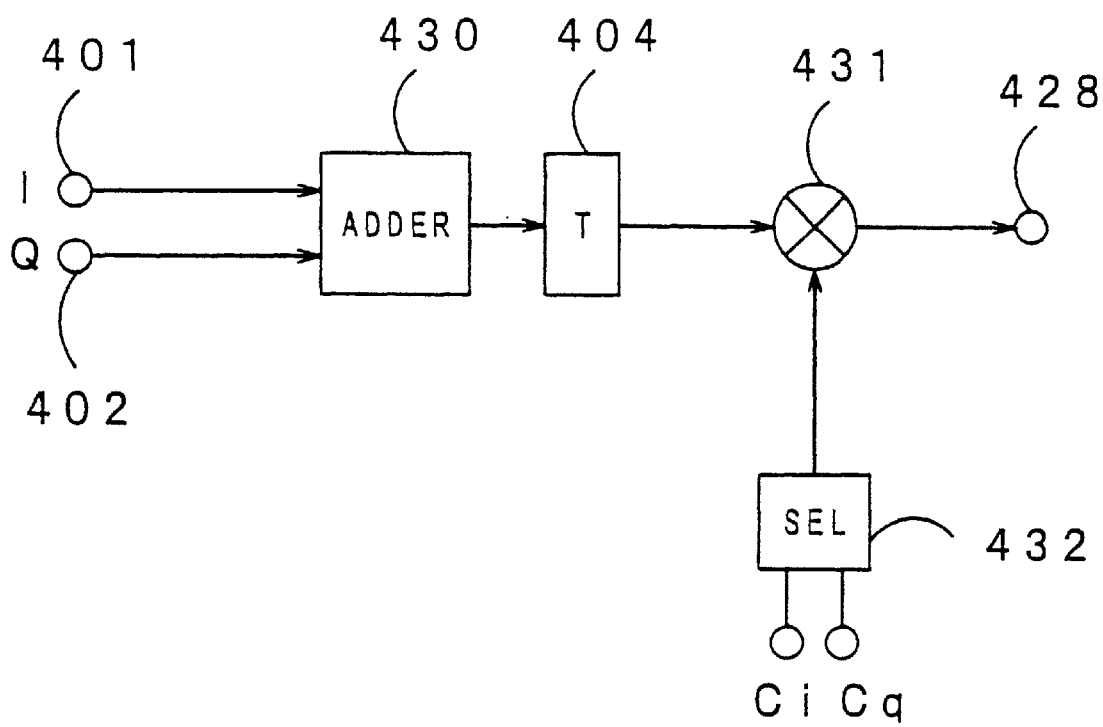
FIG. 4 indicates a concept of the correlation detecting method in the third embodiment of the present invention.

FIG. 4 indicates a concept of the correlation detecting method in the third embodiment of the present invention. In FIG. 4, 401 and 402 are input terminals. 404 is a storage circuit and 430 is a signal multiplexing circuit composed of an adder. 431 is a back-diffusion computing device and 432 is a code value switching circuit composed of a selector circuit. 428 is an output terminal and Ci is a code value for performing back-diffusion of the digital signal I and Cq is a code value for performing back-diffusion of the digital signal Q.

The correlation detecting method in this third embodiment is characterized as follows: The digital signals I and Q that are diffusion-modulated with different code values, then the signals are multiplexed and stored. After this, the stored multiplexed signal is computed for back-diffusion in a time-dividing manner.

As shown in FIG. 4, if the non-correlative digital signals that are diffusion-modulated are entered from the input terminals 401 and 402, the signal multiplexing circuit 430 multiplexes those signals I and Q and outputs the multiplexed signal to the storage circuit 404. In the back-diffusion computing device 431, the code switching circuit 432 switches the non-correlative code value between Ci and Cq in a time-dividing manner, thereby the signal entered from the storage circuit 404 is computed for back-diffusion in a time-dividing manner. Consequently, from the output terminal 428 are output correlation values with respect to the digital signals I and Q entered from the input terminals 401 and 402 respectively.

According to the third embodiment of the present invention as described above, the digital signals I and Q that are diffusion-modulated with different code values are not correlative with each other. Those non-correlative signals are then multiplexed and the multiplexed signal is computed for back-diffusion in a time-dividing manner. It is thus possible to use the same storage circuit 404 and the same back-diffusion computing device 431 to detect the correlation between the digital signals I and Q, thereby to provide a matched filter unit that can be reduced significantly in circuitry size thereby to satisfy the miniaturizing, lower manufacturing cost, and power saving prerequisites.

Furthermore, although only two input digital signals I and Q are used in this second embodiment, it is also possible to use more signals that are diffusion-modulated with different code values and entered from three or more channels in the same configuration.

[Fourth Embodiment]

Hereunder, the fourth embodiment of the present invention will be described with reference to the accompanying drawings.

Figure 5:
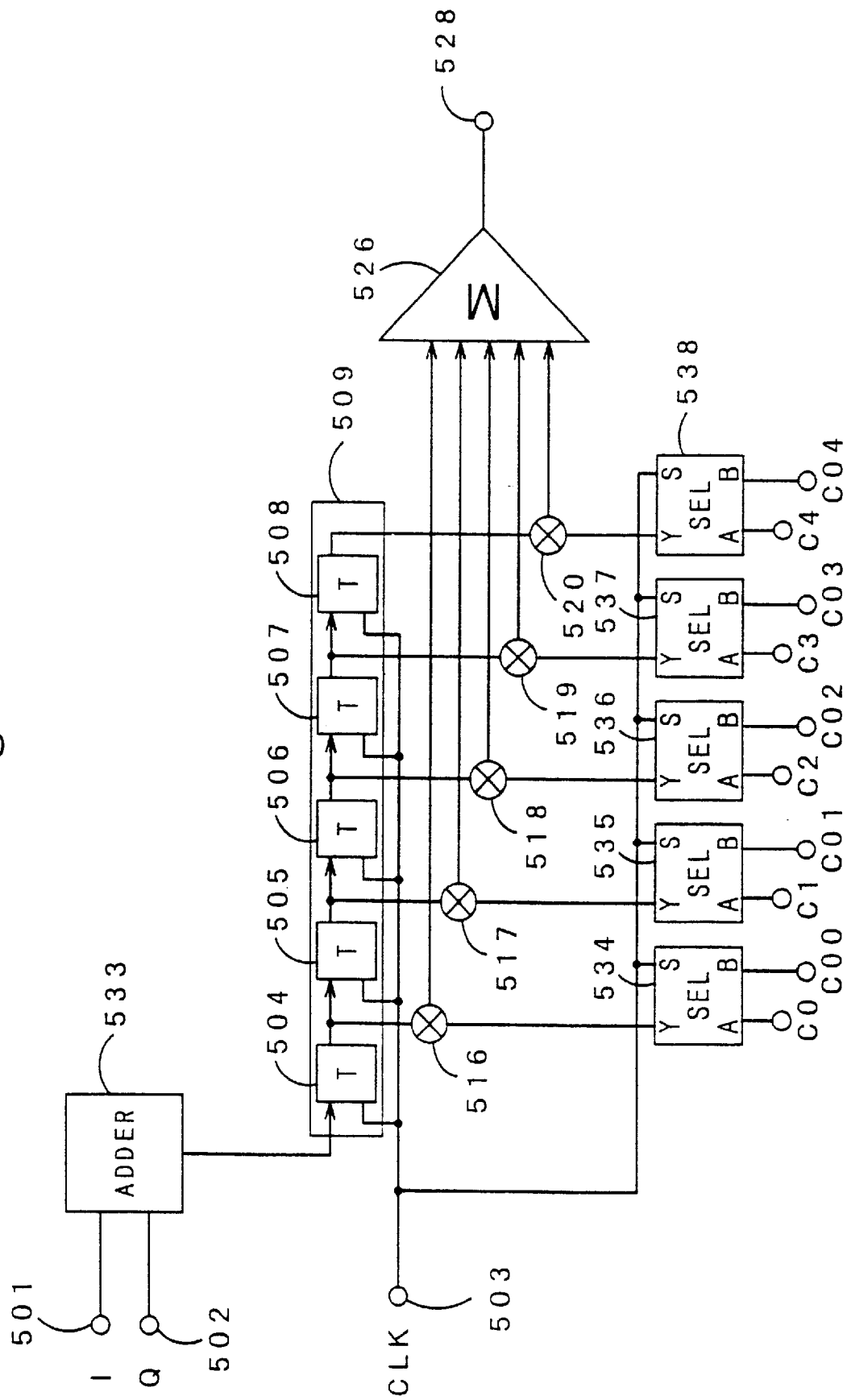
FIG. 5 is a block diagram for the matched filter unit in the fourth embodiment of the present invention.

FIG. 5 is a configuration of the matched filter unit in the fourth embodiment of the present invention.

The matched filter unit in this second embodiment is a five-time diffusion five-tap one used to perform the correlation detecting method in the third embodiment. The matched filter unit, as shown in FIG. 5, comprises input terminals 501 and 502, a clock signal input terminal 503, a shift register (storage circuit) 509 composed of delay circuits 504 to 508 disposed in 5 stages, multipliers 516 to 520, an adder 526, an output terminal 528, a signal multiplexing circuit 533 composed of an adder, and code value switching circuits 534 to 538 composed of a selector circuit respectively. Each of the code value switching circuits 534 to 538 can switch output code values between the back-diffusion code string C4C3C2C1C0 for the digital signal I and the back diffusion code string C04C03C02C01C00 for the digital signal Q in a time-dividing manner. The code value switching circuits 534 to 538 are combined to compose a digital code string switching circuit.

The input terminals 301 and 302 receive digital signals I and Q generated by sampling analog signals (for example, spectrum diffusion signals) with a 4.096 MHz sampling frequency. The digital signals I and Q are synchronized to the 4.096 MHz clock signal CLK entered to the clock signal input terminal 303.

And, if digital signals I and Q are entered to the input terminals 501 and 502 respectively, the multiplexing circuit 533 multiplexes the signals and outputs the multiplied signal to the first delay circuit 504 of the shift register 509. After this, the multiplexed signal, synchronized with the clock signal CLK, is shifted from the first delay circuit 504 to the fifth delay circuit 508 sequentially. The code value switching circuit 534 switches the code value between C0 for the digital signal I and C00 for the digital signal Q in a time-dividing manner. In the same way, each of the code value switching circuits 535 to 538 switches the code value between C1 to C4 and C01 to C04 in a time-dividing manner. The multiplier 516 then multiplies the signal output from the first delay circuit 504 of the shift register 509 by the signal output from the code value switching circuit 534, thereby only the digital signal I is back-diffused when the code value switching circuit outputs 534 C0 and only the digital signal Q is back-diffused when the circuit 534 outputs C00. In the same way, each of the multipliers 517 to 520 multiplies a signal entered from each of the delay circuits 505 to 508 by a code value entered from each of the code value switching circuits 535 to 538, thereby only the digital signal I is back-diffused when the code value is any of C1 to C4 and only the digital value Q is back-diffused when the code value is any of C01 to C04. The adder 526 adds the result of multiplication entered from each of the multipliers 516 to 520. Consequently, from the output terminal 528 are output correlation values with respect to the digital signals I and Q.

Figure 6:
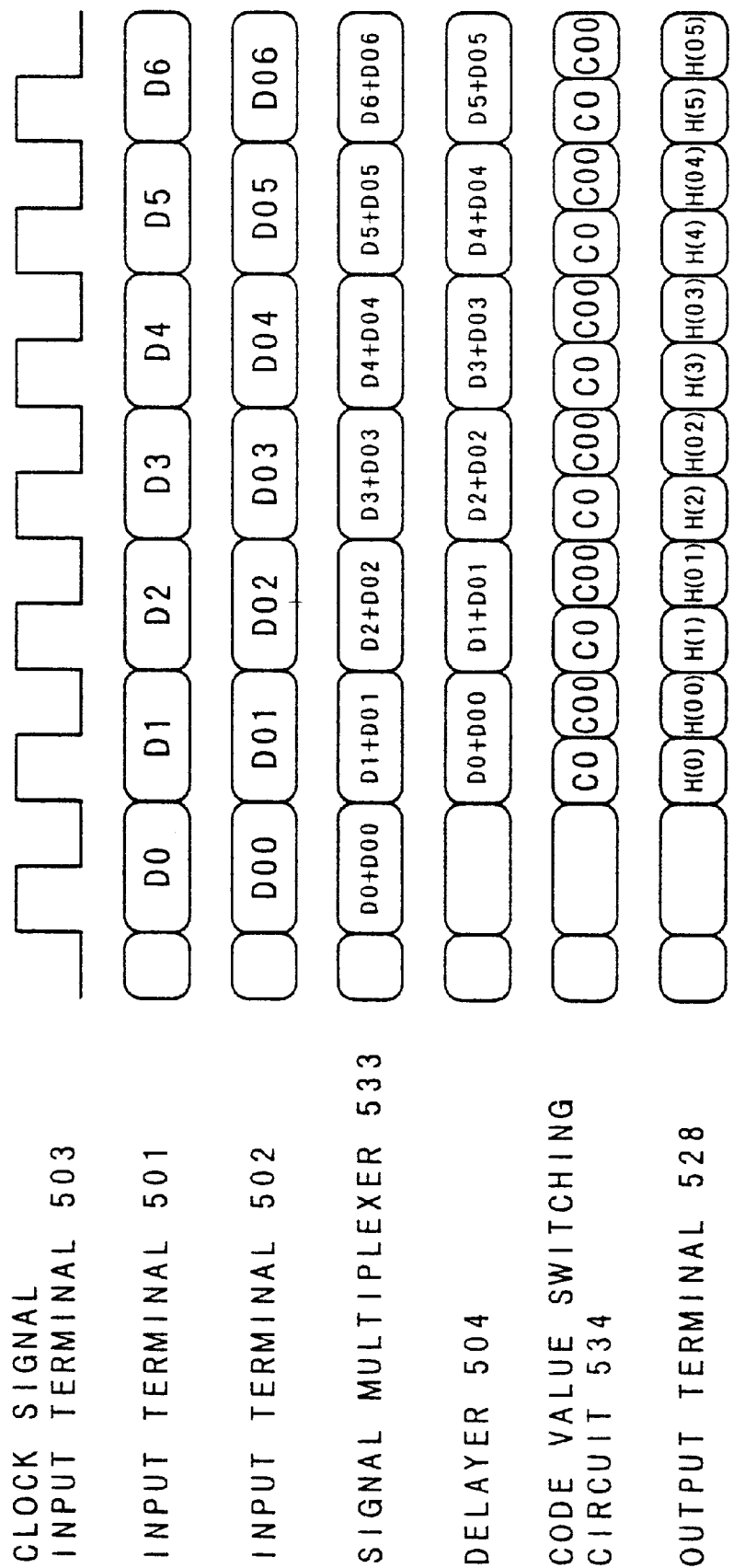
FIG. 6 is a timing chart for the matched filter unit in the fourth embodiment of the present invention.

Hereunder, description will be made for a procedure of a back-diffusion computing processing performed in each of the multipliers 516 to 525, as well as in the adder 526 with reference to the timing chart shown in FIG. 6.

In the initial state, all the signals output from the delay circuits 504 to 508 composing the shift register 509 are set in the low level.

In the first operation state, if the second sampling data D1 and D01 of the digital signal I and Q are entered to the input terminals 501 and 502 respectively in synchronization with the clock signal CLK, the data D0 and D00 are multiplexed by the signal multiplexing circuit 533, then the multiplexed signal is fetched into the first delay circuit 504. The code value switching circuit 534 outputs C0 with respect to the digital signal I when the signal entered from the clock signal input terminal 503 is set in the high level and C00 with respect to the digital signal Q when the signal entered from the clock signal input terminal 503 is set in the low level. The multiplier 516 then multiplies the signal output from the delay circuit 504 by the signal output from the code value switching circuit 534. Consequently, the multiplier 516 outputs a signal indicating the value (D0+D00)×C0 when the clock signal input terminal is set in the high level. When the terminal is set in the low level, the multiplier 516 outputs a signal indicating the value (D0+D00)×C00.

In the second operation state, if the second sampling data D1 of the digital signal I is entered to the input terminal 501 and the second sampling data D01 of the digital signal Q is entered to the input terminal 502 synchronously with the clock CLK, the signal multiplexing circuit 533 multiplexes the signals I and Q and the multiplexed signal is fetched into the first delay circuit 504. At the same time, the multiplexed signal D0+D00 of both first sampling data is fetched into the second delay circuit 505. The code value switching circuit 534 then outputs the code value C0 with respect to the digital signal I when the signal entered from the input terminal 503 is set in the high level and outputs the code value C00 with respect to the digital signal Q when the signal entered from the clock signal input terminal 503 is set in the low level. In the same way, the code value switching circuit 535 outputs C1 when the signal entered from the clock signal input terminal 503 is set in the high level and outputs C01 when the signal is set in the low level. Consequently, the multiplier 516 multiplies a signal output from the delay circuit 504 by a signal output from the code value switching circuit 534, while the multiplier 517 multiplies a signal output from the delay circuit 505 by a signal output from the code value switching circuit 535. Consequently, when the clock input terminal 503 is set in the high level, the multiplier 516 outputs a signal indicating the value (D1+D01)×C0 and the multiplier 517 outputs a signal indicating the value (D0+D00)×C1. When the clock input terminal is set in the low level, the multiplier 516 outputs a signal indicating the value (D1+D01)×C00 and the multiplier 517 outputs a signal indicating the value (D0+D00)×C01.

Hereafter, the same processings are repeated until the fourth sampling data D3 and D03 are entered to the terminals 501 and 502.

And, if the fifth sampling data D4 and D04 of the digital signals I and Q are entered to the input terminals 501 and 502 respectively in synchronization with the clock signal CLK, each multiplexed signal of the first to fifth sampling data D0 to D4 and D00 to D04 is fetched into the delay circuits 504 to 508 respectively. Consequently, when the signal entered from the clock signal input terminal 503 is set in the high level, the multiplier 516 outputs a multiplication result indicating the value (D4+D04)×C0, the multiplier 517 outputs a multiplication result indicating the value (D3+D03)×C1, the multiplier 518 outputs a multiplication result indicating the value (D2+D02)×C2, the multiplier 519 outputs a multiplication result indicating the value (D1+D01)×C3, and the multiplier 520 outputs a multiplication result indicating the value (D0+D00)×C4. When the signal entered from the clock signal input terminal 503 is set in the low level, the multiplier 516 outputs a multiplication result indicating the value (D4+D04)×C00, the multiplier 517 outputs a multiplication result indicating the value (D3+D03)×C01, the multiplier 518 outputs a multiplication result indicating the value (D2+D02)×C02, the multiplier 519 outputs a multiplication result indicating the value (D1+D01)×C03, and the multiplier 520 outputs a multiplication result indicating the value (D0+D00)×C04.

This completes all the necessary multiplications for finding a correlation value between the back-diffusion code string C4C3C2C1C0 and the first five sampling data D0 to D4 of the digital signal I, as well as a correlation value between the back-diffusion code string C04C03C02C01C00 and the first five sampling data D00 to D04 of the digital signal Q, thereby the result of multiplication in each multiplier is added in the adder 326 and input correlation values H(4) and H(04) are output from the output terminal 528 with respect to the digital signals I and Q.

According to the fourth embodiment of the present invention as described above, the digital signals I and Q that are diffusion-modulated with different code values are not correlative with each other. Those non-correlative signals are then multiplexed and the multiplexed signal is computed for back-diffusion in a time-dividing manner. Thus, it is possible to use the same delay circuits 504 to 508, the same multipliers 516 to 520, as well as the same adder 526 to detect the correlation between the digital signals I and Q, thereby to provide a matched filter unit that can be reduced significantly in circuitry size to satisfy the miniaturizing, lower manufacturing cost, and power saving prerequisites.

Furthermore, although only two input digital signals I and Q are used in this second, it is also possible to use more signals that are diffusion-modulated with different code values and entered from three or more channels in the same configuration.

[Fifth Embodiment]

Hereunder, the fifth embodiment of the present invention will be described with reference to the accompanying drawings.

Figure 7:
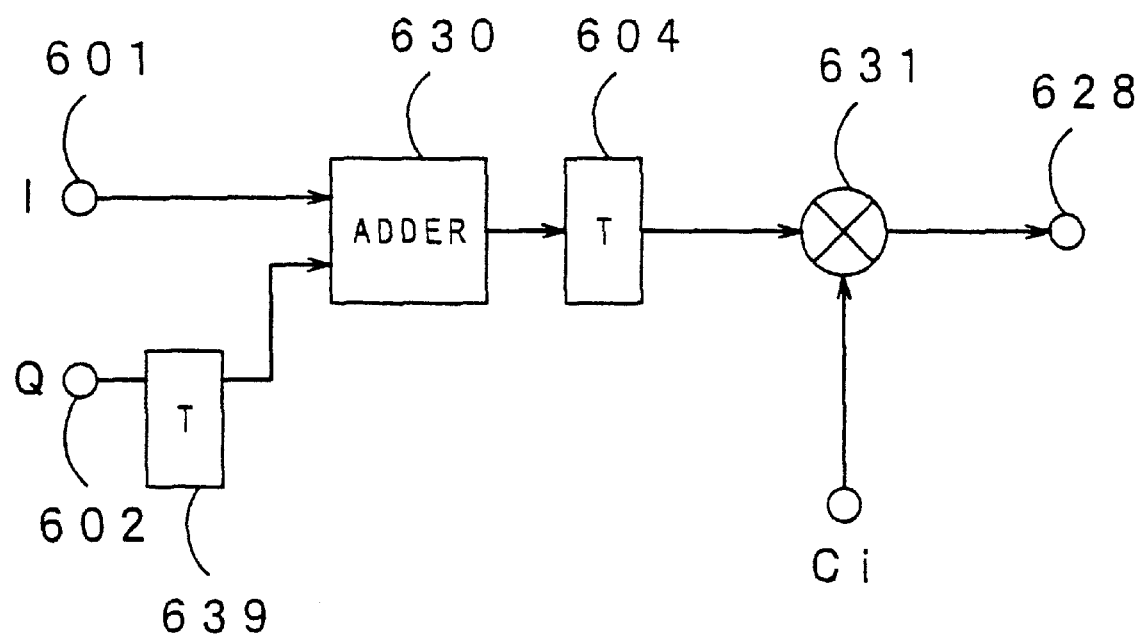
FIG. 7 indicates a concept of the correlation detecting method in the fifth embodiment of the present invention.

FIG. 7 indicates a concept of the correlation detecting method in the fifth embodiment of the present invention. In FIG. 7, 601 and 602 are input terminals. 604 is a storage circuit and 628 is an output terminal. 630 is a signal multiplexing circuit composed of an adder and 631 is a back-diffusion computing device. 639 is a phase changing circuit. Ci is a code value for performing back-diffusion of both digital signals I and Q.

The correlation detecting method in this fifth embodiment is characterized as follows: The correlation is eliminated from between the digital signals I and Q that are diffusion-modulated with the same code value by changing the phase of either of those signals, then the signals I and Q are multiplexed and stored. After this, the multiplexed signal of I and Q is computed for back-diffusion. In other words, as shown in FIG. 7, when digital signals I and Q that are diffusion-modulated with the same code value are entered to the input terminals 601 and 602 respectively, the digital signal I is entered to the signal multiplex circuit 630 as is. As for the digital signal Q, since its phase is changed in the phase changing circuit 639, the signal Q is entered to the signal multiplex circuit 630. When the phase of the digital signal Q is changed such way, therefore, the correlation between the two input digital signals I and Q is eliminated. The signals are then multiplexed by the signal multiplexing circuit 630 and the multiplexed signal is output to the storage circuit 604. The back-diffusion computing device 631 then computes the signal received from the storage circuit 604 for back-diffusion using the code value Ci. Consequently, from the output terminal 628 is output a value of correlation with respect to both digital signals I and Q entered from the input terminals 601 and 602 respectively.

According to the fifth embodiment of the present invention as described above, the correlation is eliminated from between the digital signals I and Q that are diffusion-modulated with the same code value by changing the phase of either of those signals. Furthermore, those non-correlative signals are multiplexed, then the multiplexed signal is computed for back-diffusion, so that the same storage 604 and the same back-diffusion computing device 631 can be used to detect the correlation between the digital signals I and Q. It is thus possible to provide a matched filter unit that can be reduced significantly in circuitry size thereby to satisfy the miniaturizing, lower manufacturing cost, and power saving prerequisites.

Although only two input digital signals are used in this sixth embodiment, it is also possible to use more signals that are diffusion-modulated with the same code value and entered from three or more channels in the same configuration.

[Sixth Embodiment]

Hereunder, the sixth embodiment of the present invention will be described with reference to the accompanying drawings.

Figure 8:
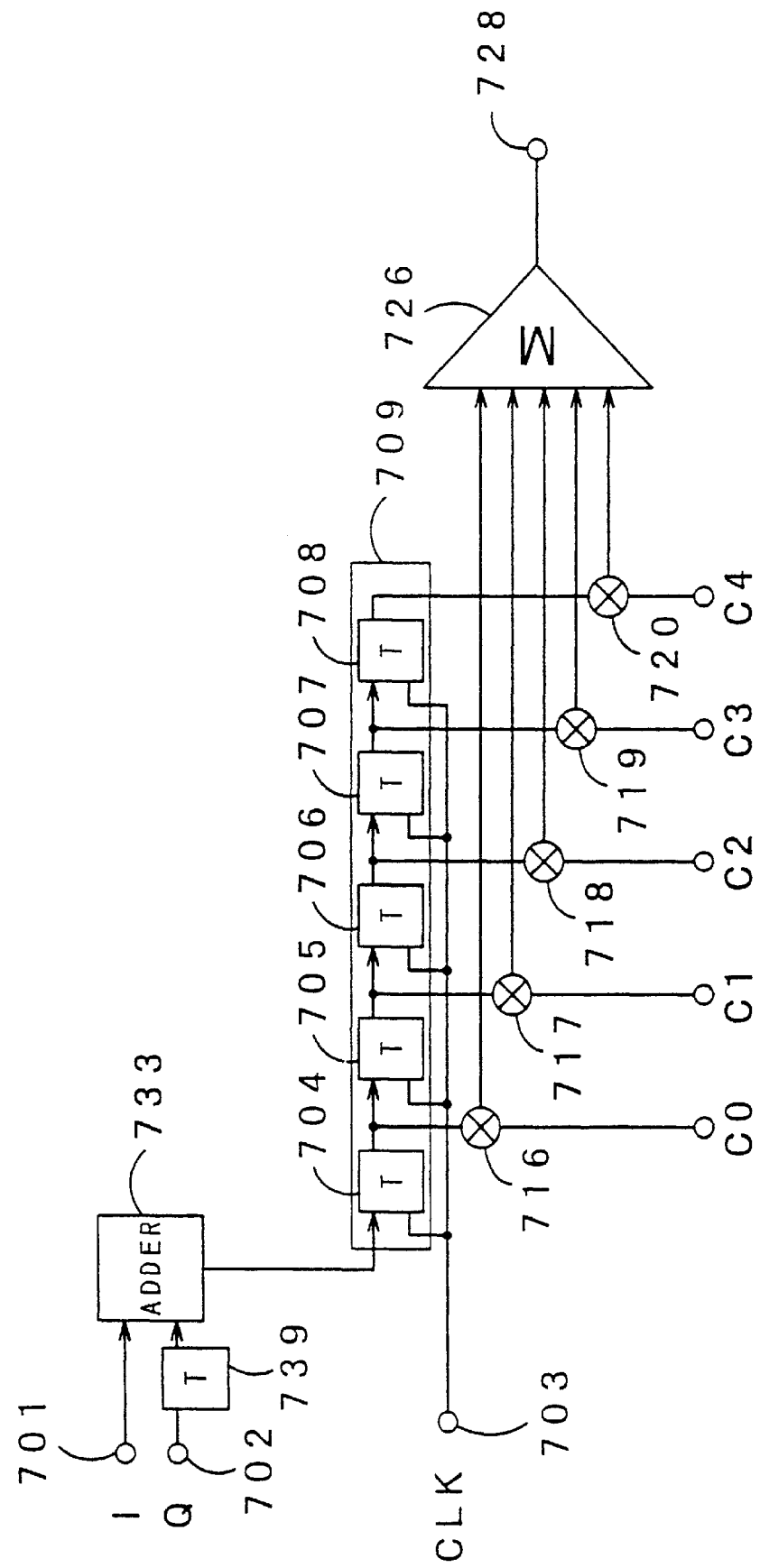
FIG. 8 is a block diagram for the matched filter unit in the sixth embodiment of the present invention.

FIG. 8 is a configuration of the matched filter unit in the sixth embodiment of the present invention.

The matched filter unit in this embodiment is a 5-time diffusion 5-tap one used to perform the correlation detecting method in the fifth embodiment. As shown in FIG. 8, the matched filter unit comprises input terminals 701 and 702, a clock signal input terminal 703, a shift register (storage circuit) 709 composed of delay circuits 704 to 708 disposed in 5 stages, multipliers 716 to 720, an adder 726, an output terminal 728, a signal multiplexing circuit 733 composed of an adder, and a phase changing circuit 739. Each of the multipliers 716 to 720 uses corresponding one of the code values of the back-diffusion code string C4C3C2C1C0 for both digital signals I and Q that are diffusion-modulated with the same code value.

To the input terminals 701 and 702 are entered digital signals I and Q generated by sampling analog signals (for example, spectrum diffusion signals) with a 4.096 MHz sampling frequency respectively. The digital signals I and Q are synchronized with a 4.096 MHz clock signal CLK entered to the clock signal input terminal 703.

If the digital signals I and Q that are diffusion-modulated with the same code value are entered to the input terminals 701 and 702 respectively, the phase changing circuit 739 changes the phase of the digital signal Q differently from the phase of the digital signal I, then the signal multiplexing circuit 733 multiplexes the digital signals I and Q. After this, the multiplied signal is entered to the first delay circuit 704 of the shift register 709, then shifted from the first delay circuit 704 to the fifth delay circuit 708 sequentially in synchronization with the clock signal CLK. The multiplier 716 then multiplies the signal output from the first delay circuit 704 of the shift register 709 by the code value C0, so that both digital signals I and Q are back-diffused. In the same way, each of the multipliers 717 to 720 multiplies the signal entered from each of the delay circuits 705 to 708 by each of the code values C1 to C4, so that both digital signals I and Q are back-diffused. The adder 726 adds results of multiplication from the multipliers 716 to 720. Consequently, the output terminal 728 outputs a value of correlation with an input of the digital signal I and a value of correlation with an input of the digital signal Q respectively.

Figure 9:
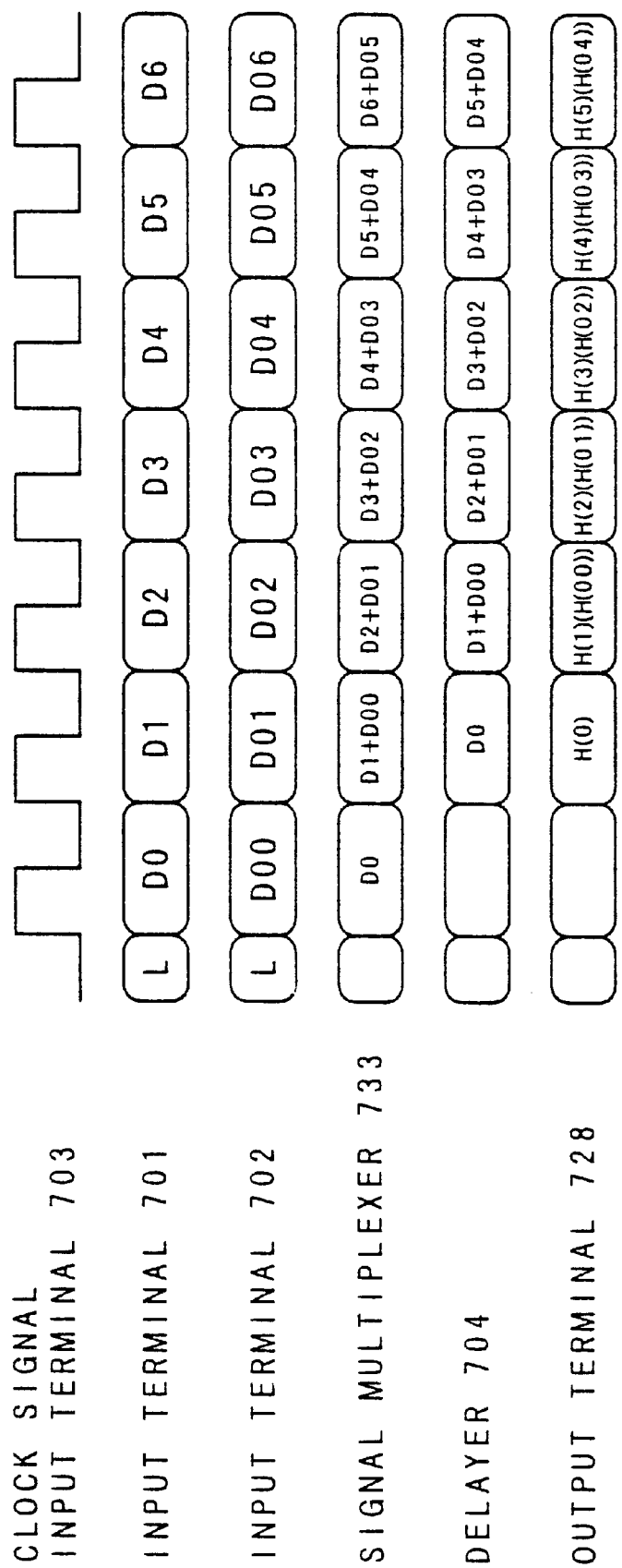
FIG. 9 is a timing chart for the matched filter unit in the sixth embodiment of the present invention.

Hereunder, description will be made for a procedure for a back-diffusion processing performed in each of the multipliers 716 to 720, as well as in the adder 726 with reference to the timing chart shown in FIG. 9.

In the initial state, all the signals output from the delay circuits 704 to 708 composing the shift register 709 are set in the low level.

In the first operation state, if the first sampling data D0 of the digital signal I is entered to the input terminal 701 and the first sampling data D00 of the digital signal Q is entered to the input terminal 702 respectively in synchronization with the clock CLK, the phase changing circuit 739 delays the phase of the digital signal Q by one clock, then the signal multiplexing circuit 733 multiplexes the first sampling data D0 of the digital signal I and the low level. The multiplexed signal is then fetched into the first delay circuit 704. The multiplier 716 then multiplies the signal output from the delay circuit 704 by the code value C0. Consequently, the multiplier 716 outputs a signal indicating the value D0×C0.

In the second operation state, if the second sampling data D1 of the digital signal I is entered to the input terminal 701 and the second sampling data D01 of the digital signal Q is entered to the input terminal 702 respectively in synchronization with the clock CLK, the phase changing circuit 739 delays the phase of the digital signal Q by one clock, then the signal multiplexing circuit 733 multiplexes D1 and D00. The multiplexed signal is then fetched into the first delay circuit 704. At the same time, the multiplexed signal of the first sampling data D0 of the digital signal I and the low level is fetched into the second delay circuit 705. Consequently, the multiplier 716 multiplies the signal output from the delay circuit 704 by the code value C0, while the multiplier 717 multiplies the signal output from the delay circuit 705 by the code value C1. Consequently, the multiplier 716 outputs a signal indicating the value (D1+D00)×C0 and the multiplier 717 outputs a signal indicating the value D0×C1.

Hereafter, the same processings are repeated until the fourth sampling data D3 and D03 are entered to the input terminals 701 and 702.

And, if the fifth sampling data D4 and D04 of the digital signals I and Q are entered to the input terminals 701 and 702 synchronously with the clock CLK, the multiplexed signals of the first to fifth sampling data D0 to D4 and the first to fourth sampling data D00 to D03 are fetched into the delay circuits 704 to 708 respectively. Consequently, the multiplier 716 outputs a result of multiplication indicating the value (D4+D03)×C0, the multiplier 717 outputs a result of multiplication indicating the value (D3+D02)×C1, the multiplier 718 outputs a result of multiplication indicating the value (D2+D01)×C2, the multiplier 719 outputs a result of multiplication indicating the value (D1+D00)×C3, and the multiplier 720 outputs a result of multiplication indicating the value D0×C4.

This completes all the necessary multiplications for finding a value of correlation between the back-diffusion code string C4C3C2C1C0 and the first five sampling data D0 to D4 of the digital signal I. As for the digital signal Q, since the phase of the digital signal Q is delayed by one clock in the phase changing circuit 739, all the necessary multiplications are performed to find a value of correlation between the back-diffusion code string C4C3C2C1C0 and the first five sampling data D00 to D04 of the digital signal Q when the sixth sampling data D5 and D05 are entered to the input terminals 701 and 702. On the other hand, the adder 726 adds results of multiplication from the multipliers, so that the input correlation result H (4) with respect to the digital signal I and the input correlation result H (04) with respect to the digital signal Q are output from the output terminal 728 respectively.

According to the sixth embodiment as described above, the correlation is eliminated from between the digital signals I and Q that are diffusion-modulated with the same code value by changing the phase of either of those signals, then those non-correlative signals are multiplexed. After this, the multiplexed signal is computed for back-diffusion, so that the same delay circuits 704 to 708, the same multipliers 716 to 720, and the same adder 726 can be used for the back-diffusion computing processing of the two digital signals I and Q. It is thus possible to provide a matched filter unit that can be reduced significantly in circuitry size thereby to satisfy the miniaturizing, lower manufacturing cost, and power saving prerequisites.

Although only two input digital signals I and Q are used in this embodiment, it is also possible to use more signals that are diffusion-modulated with the same code value and entered from three or more channels in the same configuration.

[Seventh Embodiment]

Hereunder, the seventh embodiment of the present invention will be described with the accompanying drawings.

Figure 10:
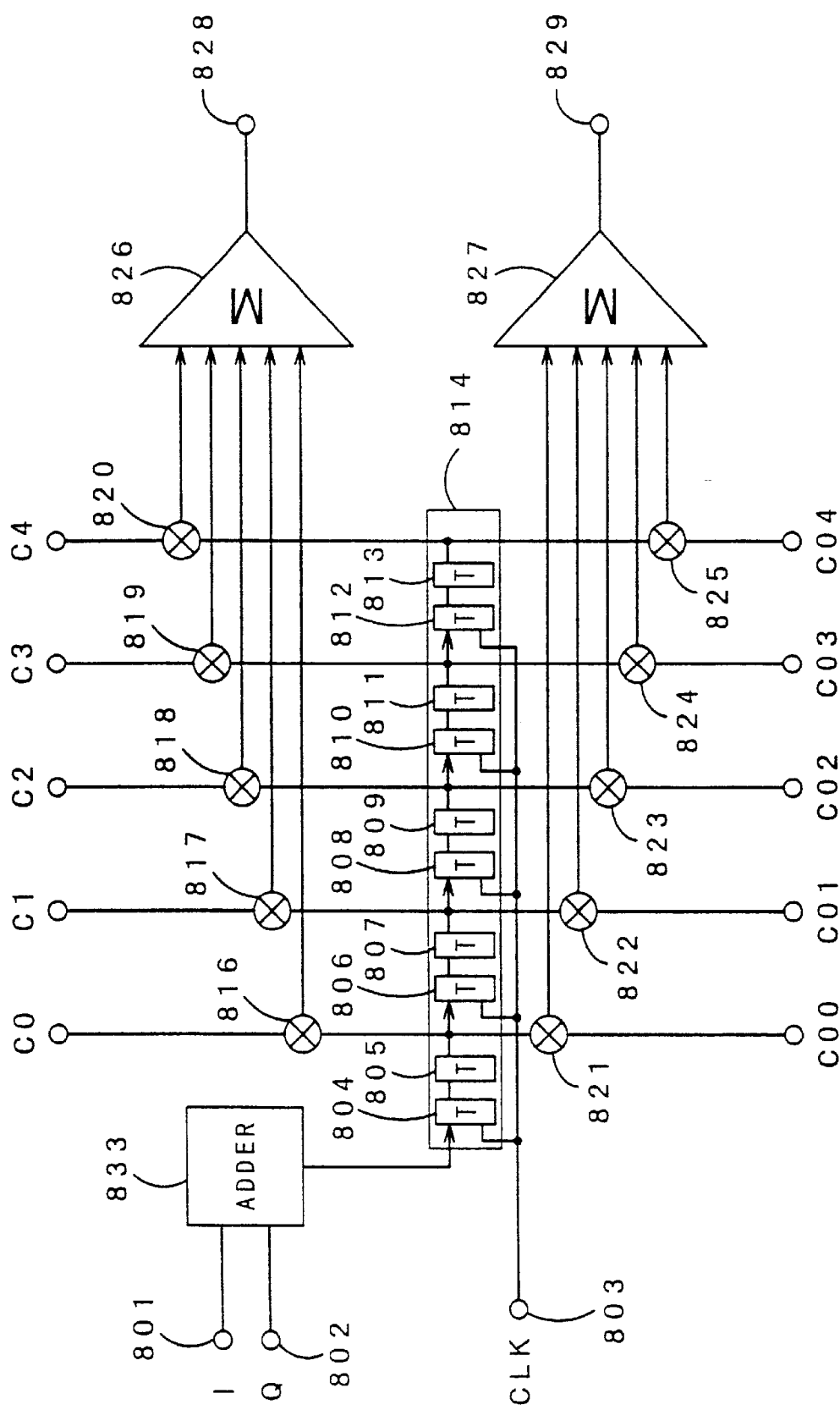
FIG. 10 is a block diagram for the matched filter unit in the seventh embodiment of the present invention.

FIG. 10 is a configuration of the matched filter unit in the seventh embodiment of the present invention.

The matched filter unit in this embodiment is a 5-time diffusion 10-tap one used to perform the correlation detecting method in the first embodiment. The matched filter unit comprises input terminals 801 and 802, a clock signal input terminal 803, a shift register (storage circuit) 814 composed of delay circuits 804 to 813 disposed in 10 stages, multipliers 816 to 825, adders 826 and 827, output terminals 828 and 829, and a signal multiplexing circuit 833 composed of an adder. Each of the multipliers 816 to 820 uses corresponding one of the code values of the back-diffusion code string C4C3C2C1C0 for the digital signal I. Each of the multipliers 821 to 825 uses corresponding one of the code values of the back-diffusion code string C04C03C02C01C00 for the digital signal Q.

To the input terminals 801 and 802 are entered digital signals I and Q generated by sampling analog signals (for example, spectrum diffusion signals) with a 8.192 Mhz sampling frequency (double the sampling frequency in the second embodiment). The digital signals I and Q are synchronized with a 8.192 MHz clock CLK entered to the clock signal input terminal 803.

And, if digital signals I and Q are entered to the input terminals 801 and 802 respectively, the signal multiplexing circuit 833 multiplexes the signals, then the multiplexed signal is entered to the first delay circuit 804 of the shift register 814. After this, the multiplexed signal is shifted from the first delay circuit 804 to the tenth delay circuit 813 sequentially in synchronization with the clock signal CLK.

The multiplier 816 then multiplies the signal output from the second delay circuit 805 of the shift register 814 by the code value C0, so that the digital signal I is back-diffused. In the same way, each of the multipliers 817 to 820 multiplies the signal entered from each even-numbered delay circuit of the delay circuits 806 to 813 by each of the code values C1 to C4 thereby to back-diffuse the digital signal I. The multiplier 821 multiplies the signal output from the second delay circuit 805 of the shift register 814 by the code value C00 thereby to back-diffuse the digital signal Q. In the same way, each of the multipliers 822 to 825 multiplies the signal entered from each even-numbered delay circuit of the delay circuits 806 to 813 by each of the code values C01 to C04 thereby to back-diffuse the digital signal Q. The adder 826 then adds results of multiplication entered from the multipliers 816 to 820. The adder 827 adds results of multiplication entered from the multipliers 821 to 824. Consequently, correlation values with inputs of the digital signals I and Q are output from the output terminals 828 and 829 respectively.

Figure 11:
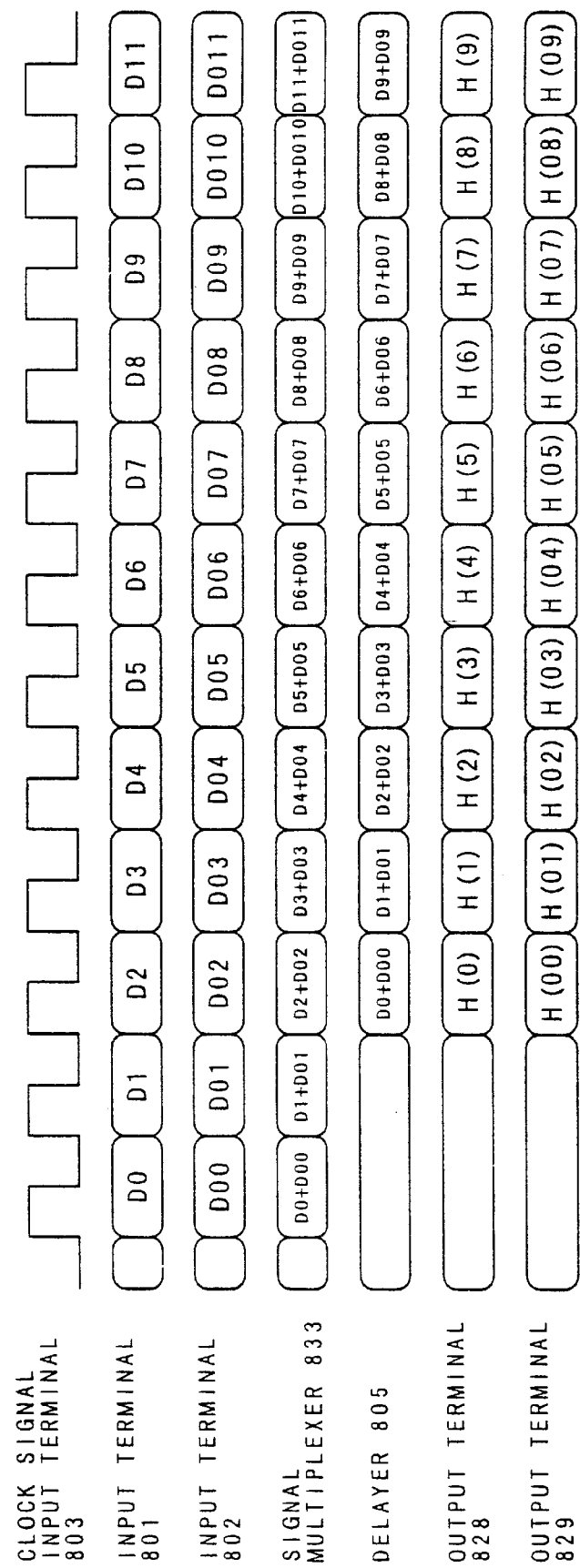
FIG. 11 is a timing chart for the matched filter unit in the seventh embodiment of the present invention.

Hereunder, description will be made for a procedure of a back-diffusion computing processing performed in each of the multipliers 816 to 825, as well as in the adders 826 and 827 with reference to the timing chart shown in FIG. 11.

In the initial state, all the signals output from the delay circuits 804 to 813 composing the shift register 814 are set in the low level.

In the first operation state, if the first sampling data D0 of the digital signal I is entered to the input terminal 801 and the first sampling data D00 of the digital signal Q is entered to the input terminal 802 respectively in synchronization with a clock signal CLK, the signal multiplexing circuit 833 multiplexes the signals I and Q. The multiplexed signal is then fetched into the first delay circuit 804. After this, when the second sampling data D1 and D01 of the digital signals I and Q are entered to the input terminals 801 and 802 respectively in synchronization with the clock signal CLK, the signal multiplexing circuit 833 multiplexes the signals I and Q. The multiplexed signal is then fetched into the first delay circuit 804. At the same time, the multiplexed signal D0+D00 of both first sampling data is fetched into the second delay circuit 805. The multiplier 816 multiplies the signal output from the delay circuit 805 by the code value C0. The multiplier 821 multiplies the signal output from the delay circuit 805 by the code value C00. Consequently, the multiplier 816 outputs a signal indicating the value (D0+D00)×C0 and the multiplier 821 outputs a signal indicating the value (D0+D00)×C00.

In the second operation state, the third sampling data D2 of the digital signal I is entered to the input terminal 801 and the third sampling data D02 of the digital signal Q is entered to the input terminal 802 respectively in synchronization with the clock signal CLK respectively. The signal multiplexing circuit 833 then multiplexes the signals I and Q and the multiplexed signal is fetched into the first delay circuit 804. At this time, the multiplexed signal D2+D02 of both third sampling data of the digital signals I and Q is fetched into the second delay circuit 805, the multiplexed signal D1+D01 of both second sampling data of the digital signals I and Q is fetched into the third delay circuit 806, and the multiplexed signal D0+D00 of both first sampling data of the digital signals I and Q is fetched into the fourth delay circuit 807. Consequently, the multiplier 816 multiplies the signal output from the delay circuit 805 by the code value C0, the multiplier 817 multiplies the signal output from the delay circuit 807 by the code value C1, the multiplier 821 multiplies the signal output from the delay circuit 805 by the code value C00, and the multiplier 822 multiplies the signal output from the delay circuit 807 by the code value C01. Consequently, the multiplier 816 outputs a signal indicating the value (D2+D02)×C0, the multiplier 817 outputs a signal indicating the value (D0+D00)×C1, the multiplier 821 outputs a signal indicating the value (D2+D02)×C00, and the multiplier 822 outputs a signal indicating the value (D0+D00)×C01.

Hereafter, the same processings are repeated until the ninth sampling data D8 and D08 are entered to the input terminals 801 and 802.

And, if the tenth sampling data D9 and D09 of the digital signals I and Q are entered to the input terminals 801 and 802 respectively in synchronization with the clock signal CLK, each of the multiplexed signals of the first to tenth sampling data D0 to D9 and D00 to D09 is fetched into each of the delay circuits 804 to 813. Consequently, the multiplier 816 outputs a result of multiplication indicating the value (D8+D08)×C0, the multiplier 817 outputs a result of multiplication indicating the value (D6+D06)×C1, the multiplier 818 outputs a result of multiplication indicating the value (D4+D04)×C2, the multiplier 819 outputs a result of multiplication indicating the value (D2+D02)×C3, the multiplier 820 outputs a result of multiplication indicating the value (D0+D00)×C4, the multiplier 821 outputs a result of multiplication indicating the value (D8+D08)×C00, the multiplier 822 outputs a result of multiplication indicating the value (D6+D06)×C01, the multiplier 823 outputs a result of multiplication indicating the value (D4+D04)×C02, the multiplier 824 outputs a result of multiplication indicating the value (D2+D02)×C03, and the multiplier 825 outputs a result of multiplication indicating the value (D0+D00)×C04 respectively.

This completes all the necessary multiplications for finding a value of correlation between the back-diffusion code string C4C3C2C1C0 and each even-numbered data of the first 10 sampling data D0 to D9 of the digital signal I, as well as all the necessary multiplications for finding a value of correlation between the back-diffusion code string C04C03C02C01C00 and each even-numbered data of the first 10 sampling data D0 to D9 of the digital signal Q. Then, the adders 826 and 827 add results of multiplication entered from the multipliers and outputs correlation results H (7) and H (07) with respect to the digital signals I and Q from the output terminals 828 and 829 respectively.

According to the seventh embodiment as described above, digital signals I and Q that are diffusion-modulated with different code values are not correlative with each other and those non-correlative signals I and Q are multiplexed. The multiplexed signal is then computed for back-diffusion. Consequently, it is possible to use the same delay circuits 804 to 813 for back-diffusion computing of those two digital signals I and Q to provide a matched filter unit that can be reduced significantly in circuitry size thereby to satisfy the miniaturizing, lower manufacturing cost, and power saving prerequisites.

Although only two input digital signals I and Q are used in this embodiment, it is also possible to use more input digital signals that are diffusion-modulated with different code values and entered from three or more channels in the same configuration.

Furthermore, the second embodiment shown in FIG. 2 is composed so as to perform the correlation detecting method in the first embodiment and the matched filter unit receives digital signals I and Q generated by sampling analog signals with a 4.096 MHz sampling frequency. In this embodiment, however, digital signals I and Q entered to the matched filter unit are generated by sampling analog signals with a 8.192 MHz frequency (double the sampling frequency in the second embodiment). Consequently, the shift register 814 shown in FIG. 10 uses delay circuits disposed in stages double in quantity those of the shift register 309 shown in FIG. 2. Then, signals from each second delay circuit are entered to the multipliers. In the same way, digital signals I and Q may also be over-sampled with a frequency clock three times or over the frequency clock used in the second embodiment, of course.

[Eighth Embodiment]

Hereunder, the eighth embodiment of the present invention will be described with the accompanying drawings.

Figure 12:
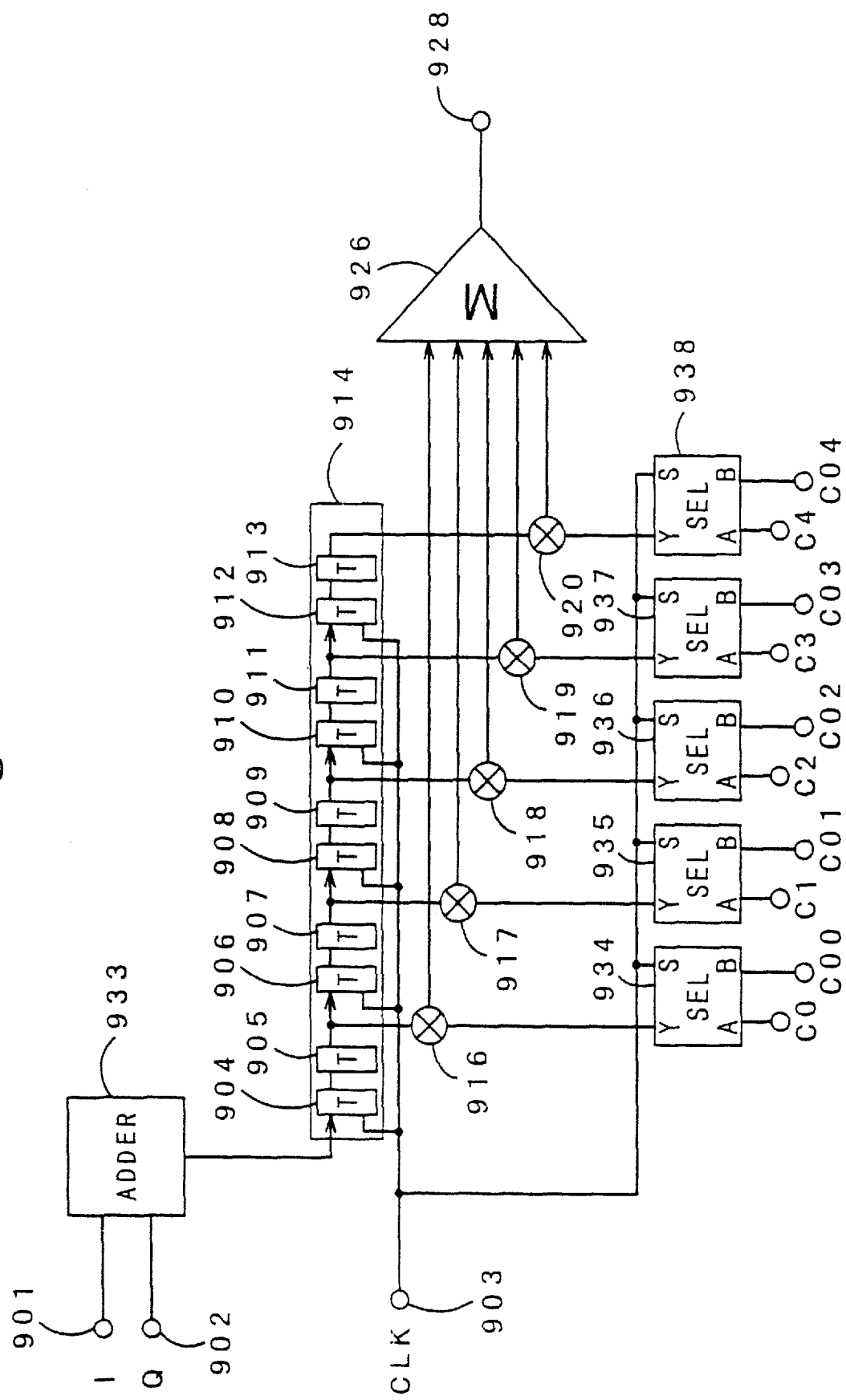
FIG. 12 is a block diagram for the matched filter unit in the eighth embodiment of the present invention.

FIG. 12 is a configuration of the matched filter unit in the eighth embodiment of the present invention.

The matched filter unit in this embodiment is a 5-time diffusion 10-tap one used to perform the correlation detecting method in the third embodiment. As shown in FIG. 12, the matched filter unit comprises input terminals 901 and 902, a clock signal input terminal 903, a shift register (storage circuit) 914 composed of delay circuits 904 to 913 disposed in 10 stages, multipliers 916 to 925, an adder 926, an output terminal 928, a signal multiplexing circuit 933 composed of an adder, and code value switching circuits 934 to 938 composed of a selector circuit respectively. Each of the code value switching circuits 934 to 938 can switch output code values between the back-diffusion code string C4C3C2C1C0 for the digital signal I and the back-diffusion code string C04C03C02C01C00 for the digital signal Q. Those code value switching circuits 934 to 938 are combined to compose a digital code string switching circuit.

To the input terminals 901 and 902 are entered digital signals I and Q generated by sampling analog signals (for example, spectrum diffusion signals) with a 8.192 MHz sampling frequency (double the sampling frequency in the first embodiment). The digital signals I and Q are synchronized with the 8.192 MHz clock CLK entered to the clock signal input terminal 903. And, if digital signals I and Q are entered to the input terminals 901 and 902 respectively, the signal multiplexing circuit 933 multiplexes the signals, then the multiplexed signal is entered to the first delay circuit 904 of the shift register 914. After this, the multiplexed signal is shifted from the first delay circuit 904 to the tenth delay circuit 913 sequentially in synchronization with the clock signal CLK. The code value switching circuit 934 then switches the code value between C0 of the digital signal I and C00 of the digital signal Q in a time-dividing manner. In the same way, each of the code value switching circuits 935 to 938 switches the code value between C1 to C4 and C01 to C04 respectively in a time-dividing manner. The multiplier 916 multiplies the signal output from the second delay circuit 905 of the shift register 914 by the signal output from the code value switching circuit 934, so that only the digital signal I is back-diffused when the code value is C0 and only the digital signal Q is back-diffused when the code value is C00. In the same way, each of the multipliers 917 to 920 multiplies the signal entered from each even-numbered delay circuit of the delay circuits 906 to 913 by each of the code value entered from each even-numbered delay circuit of the delay circuits 906 to 013, so that only the digital signal I is back-diffused when the code value is any of C1 to C4 and only the digital signal Q is back-diffused when the code value is any of C01 to C04. The adder 926 then adds results of multiplication entered from the multipliers 916 to 920. Consequently, correlation values with respect to the inputs of the digital signals I and Q are output from the output terminals 928.

Figure 13:
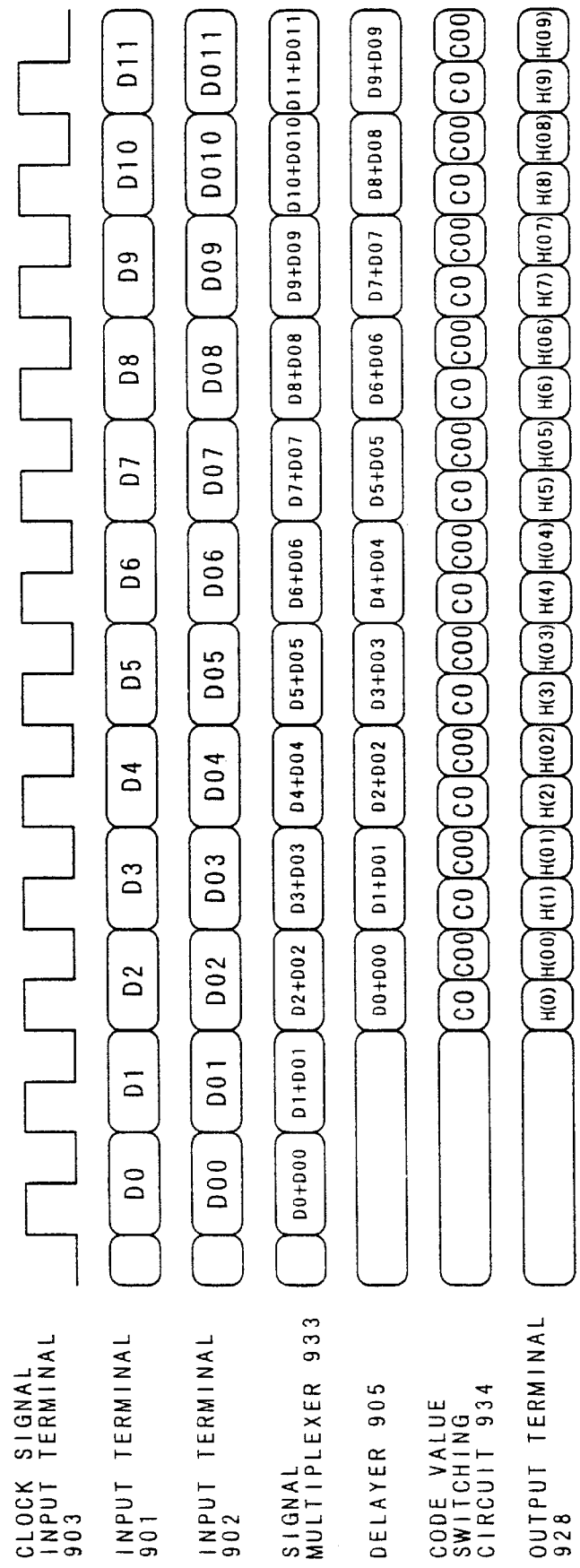
FIG. 13 is a timing chart for the matched filter unit in the eighth embodiment of the present invention.

Hereunder, description will be made for a procedure of a back-diffusion computing processing performed in each of the multipliers 916 to 920, as well as in the adder 926 with reference to the timing chart shown in FIG. 13.

In the initial state, all the signals output from the delay circuits 904 to 913 composing the shift register 914 are set in the low level.

In the first operation state, if the first sampling data D0 of the digital signal I is entered to the input terminal 901 and the first sampling data D00 of the digital signal Q is entered to the input terminal 902 synchronously with a clock signal CLK, the signal multiplexing circuit 933 multiplexes sampling data D0 and D00. The multiplexed signal is then fetched into the first delay circuit 904. The code value switching circuit 934 then outputs the code value C0 of the digital signal I when the signal entered from the clock signal input terminal 903 is set in the high level and outputs the code value C00 of the digital signal Q when the signal entered from the clock signal input terminal 903 is set in the low level. After this, if the second sampling data D1 and D01 of the digital signals I and Q are entered to the input terminals 901 and 902 respectively in synchronization with the clock signal CLK, the signal multiplexing circuit 933 multiplexes both sampling data D1 and D01. The multiplexed signal is then fetched into the first delay circuit, as well as the multiplied signal D0+D00 of both first sampling data is fetched into the second delay circuit 905. The multiplier 916 then multiplies the signal output from the delay circuit 905 by the signal output from the code value switching circuit 934. Consequently, when the clock signal input terminal 903 is set in the high level, the multiplier 916 outputs a signal indicating the value (D0+D00)×C0. When the clock signal input terminal 503 is set in the low level, the multiplier 916 outputs a signal indicating the value (D0+D00)×C00.

In the second operation state, if the third sampling data D2 of the digital signal I is entered to the input terminal 901 and the third sampling data D02 of the digital signal Q is entered to the input terminal 902 synchronously with the clock CLK, the signal multiplexing circuit 933 multiplexes the signals I and Q and the multiplexed signal is fetched into the first delay circuit 904. At the same time, the multiplexed signal D1+D01 of both second sampling data is fetched into the second delay circuit 905. Furthermore, the multiplexed signal D0+D00 of both first sampling data is fetched into the third delay circuit 906. Then, if the fourth sampling data D3 of the digital signal I is entered to the input terminal 901 and the fourth sampling data of the digital signal Q is entered to the input terminal 902 synchronously with the clock CLK respectively, the signal multiplexing circuit 933 multiplies the data and the multiplexed signal is fetched into the first delay circuit 904. At the same time, the multiplexed signal D2+D02 of both third sampling data is fetched into the second delay circuit 905 and the multiplexed signal D1+D01 of both second sampling data is fetched into the third delay circuit 906. Furthermore, the multiplexed signal D0+D0 of both first sampling data is fetched into the fourth delay circuit 907. The code value switching circuit 934 then outputs the code value C0 with respect to the digital signal I when the signal entered from the input terminal 903 is set in the high level and outputs the code value C00 with respect to the digital signal Q when the signal entered from the clock signal input terminal 903 is set in the low level. In the same way, the code value switching circuit 935 outputs C1 when the signal entered from the clock signal input terminal 903 is set in the high level and outputs C01 when the signal is set in the low level. Consequently, the multiplier 916 multiplies the signal output from the delay circuit 905 by the signal output from the code value switching circuit 934, while the multiplier 917 multiplies the signal output from the delay circuit 907 by the signal output from the code value switching circuit 935. Consequently, when the clock input terminal 903 is set in the high level, the multiplier 916 outputs a signal indicating the value (D2+D02)×C0 and the multiplier 917 outputs a signal indicating the value (D0+D00)×C1. When the clock input terminal 903 is set in the low level, the multiplier 516 outputs a signal indicating the value (D2+D02)×C00 and the multiplier 917 outputs a signal indicating the value (D0+D00)×C01.

The same processings are then repeated until the ninth sampling data D8 and D08 are entered to the input terminals 901 and 902.

And, if the tenth sampling data D9 and D09 of the digital signals I and Q are entered to the input terminals 901 and 902 respectively in synchronization with the clock signal CLK, each of the multiplexed signals of the first to tenth sampling data D0 to D9 and D00 to D09 is fetched into each of the delay circuits 904 to 913. Consequently, if the signal entered from the clock signal input terminal 903 is set in the high level, the multiplier 916 outputs a result of multiplication indicating the value (D8+D08)×C0, the multiplier 917 outputs a result of multiplication indicating the value (D6+D06)×C1, the multiplier 918 outputs a result of multiplication indicating the value (D4+D04)×C2, the multiplier 919 outputs a result of multiplication indicating the value (D2+D02)×C3, and the multiplier 920 outputs a result of multiplication indicating the value (D0+D00)×C4. If the signal entered from the clock signal input terminal 903 is set in the low level, the multiplier 916 outputs a result of multiplication indicating the value (D8+D08)×C00, the multiplier 917 outputs a result of multiplication indicating the value (D6+D06)×C01, the multiplier 918 outputs a result of multiplication indicating the value (D4+D04)×C02, the multiplier 919 outputs a result of multiplication indicating the value (D2+D02)×C03, and the multiplier 920 outputs a result of multiplication indicating the value (D0+D00)×C04.

This completes all the necessary multiplications for finding a value of correlation between the back-diffusion code string C4C3C2C1C0 and each even-numbered data of the first 10 sampling data D0 to D9 of the digital signal I, as well as all the necessary multiplications for finding a value of correlation between the back-diffusion code string C04C03C02C01C00 and each even-numbered data of the first 10 sampling data D0 to D9 of the digital signal Q. Then, the adder 926 adds results of multiplication entered from each of the multipliers and outputs correlation results H (7) and H (07) with respect to the digital signals I and Q from the output terminal 928 respectively in a time-dividing manner.

According to the eighth embodiment as described above, the digital signals I and Q that are diffusion-modulated with different code values are not correlative with each other and those non-correlative signals I and Q are multiplexed. The multiplexed signal is then computed for back-diffusion in a time-dividing manner. Consequently, the same delay circuits 904 to 913, as well as the same multipliers 916 to 920 can be used for back-diffusion computing of those two digital signals I and Q thereby to provide a matched filter unit that can be reduced significantly in circuitry size thereby to satisfy the miniaturizing, lower manufacturing cost, and power saving prerequisites.

Although only two input digital signals I and Q are used in this embodiment, it is also possible to use more digital signals that are diffusion-modulated with different code values and entered from three or more channels in the same configuration.

Furthermore, although the fourth embodiment shown in FIG. 5 is composed so as to perform the correlation detecting method in the third embodiment and the matched filter unit receives digital signals I and Q generated by sampling analog signals with a 4.096 MHz sampling frequency, the digital signals I and Q entered to the matched filter unit in this embodiment are generated by sampling analog signals with a 8.192 MHz frequency (double the sampling frequency in the fourth embodiment). Consequently, the shift register 914 shown in FIG. 12 uses delay circuits disposed in stages double as many as those of the shift register 509 shown in FIG. 5. Then, the signal from each second delay circuit is entered to the corresponding multiplier. In the same way, digital signals I and Q may also be over-sampled with a frequency clock three times or over the above one, of course.

[Ninth Embodiment]

Hereunder, the ninth embodiment of the present invention will be described with the accompanying drawings.

Figure 14:
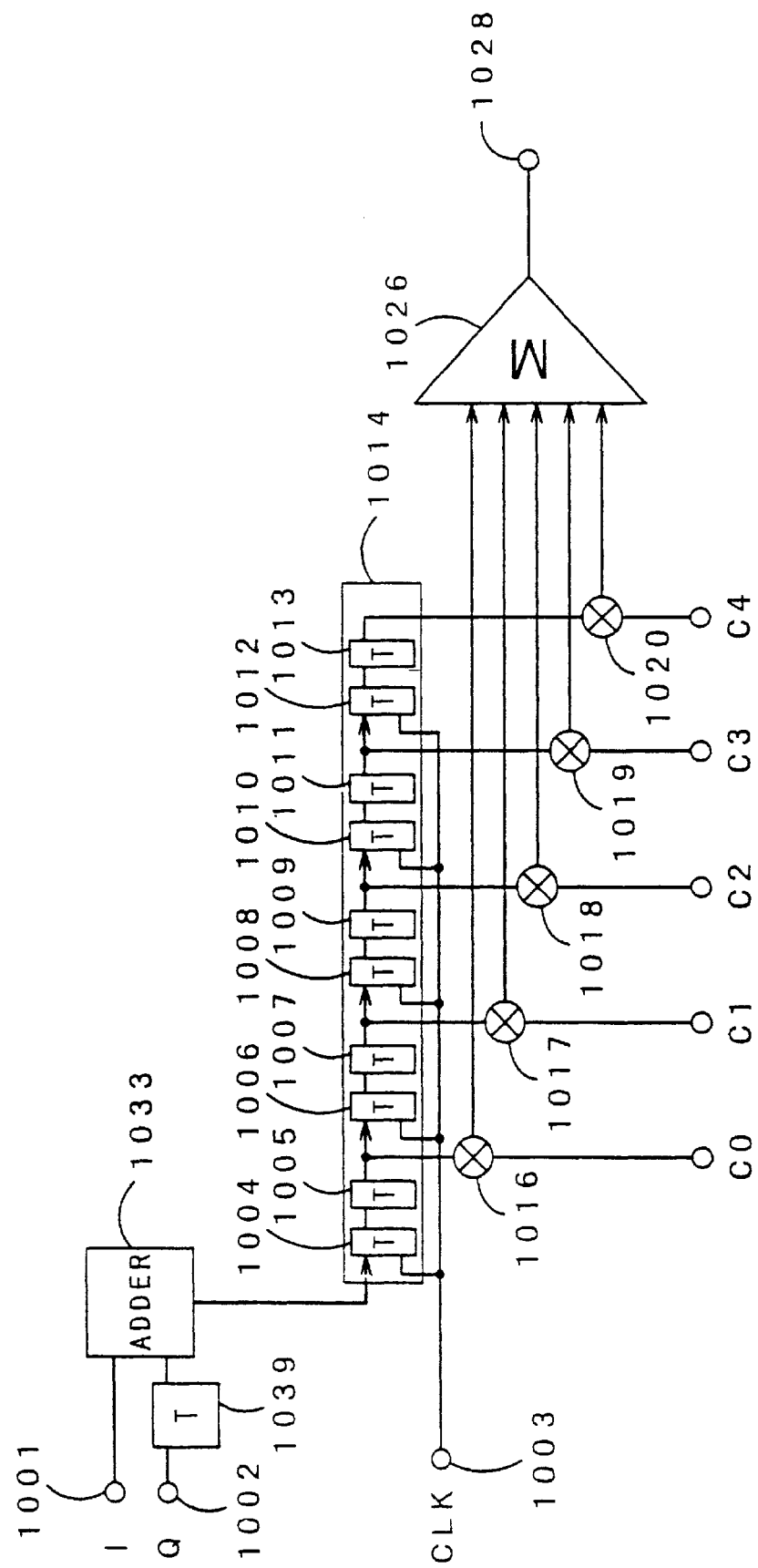
FIG. 14 is a block diagram for the matched filter unit in the ninth embodiment of the present invention.

FIG. 14 is a configuration of the matched filter unit in the ninth embodiment of the present invention.

The matched filter unit in this embodiment is a 5-time diffusion 10-tap one used to perform the correlation detecting method in the fifth embodiment. As shown in FIG. 14, the matched filter unit comprises input terminals 1001 and 1002, a clock signal input terminal 1003, a shift register (storage circuit) 1014 composed of delay circuits 1004 to 1013 disposed in 10 stages, multipliers 1016 to 1020, an adder 1026, an output terminal 1028, a signal multiplexing circuit 1033 composed of an adder, and a phase changing circuit 1039. Each of the multipliers 1016 to 1020 uses corresponding one of the code values of the back-diffusion code string C4C3C2C1C0 for both digital signals I and Q that are diffusion-modulated with the same code value.

To the input terminals 1001 and 1002 are entered digital signals I and Q generated by sampling analog signals (for example, spectrum diffusion signals) with a 8.192 Mhz sampling frequency (double the sample frequency in the sixth embodiment). The digital signals I and Q are synchronized with a 8.192 MHz clock CLK entered to the clock signal input terminal 1003.

And, if digital signals I and Q that are diffusion-modulated with the same code value are entered to the input terminals 1001 and 1002 respectively, the phase changing circuit 1039 changes the phase of the digital signal Q differently from the phase of the digital signal I, then the signal multiplexing circuit 1033 multiplexes the digital signals I and Q. The multiplexed signal is then entered to the first delay circuit 1004 of the shift register 1014. The multiplexed signal is then shifted from the first delay circuit 1004 to the tenth delay circuit 1013 sequentially in synchronization with the clock signal CLK. The multiplier 1016 multiplies the signal output from the delay circuit 1005 of the shift register 1014 by the code value C0, so that each of the digital signals I and Q is back-diffused. In the same way, each of the multipliers 1017 to 1020 multiplies the signal entered from each even-numbered delay circuit of the delay circuits 1006 to 1013 by corresponding one of the code values C1 to C4, thereby each of the digital signals I and Q is back-diffused. The adder 1026 then adds results of multiplication entered from the multipliers 1016 to 1020. Consequently, values of correlation with inputs of the digital signals I and Q are output from the output terminal 1028 respectively.

Figure 15:
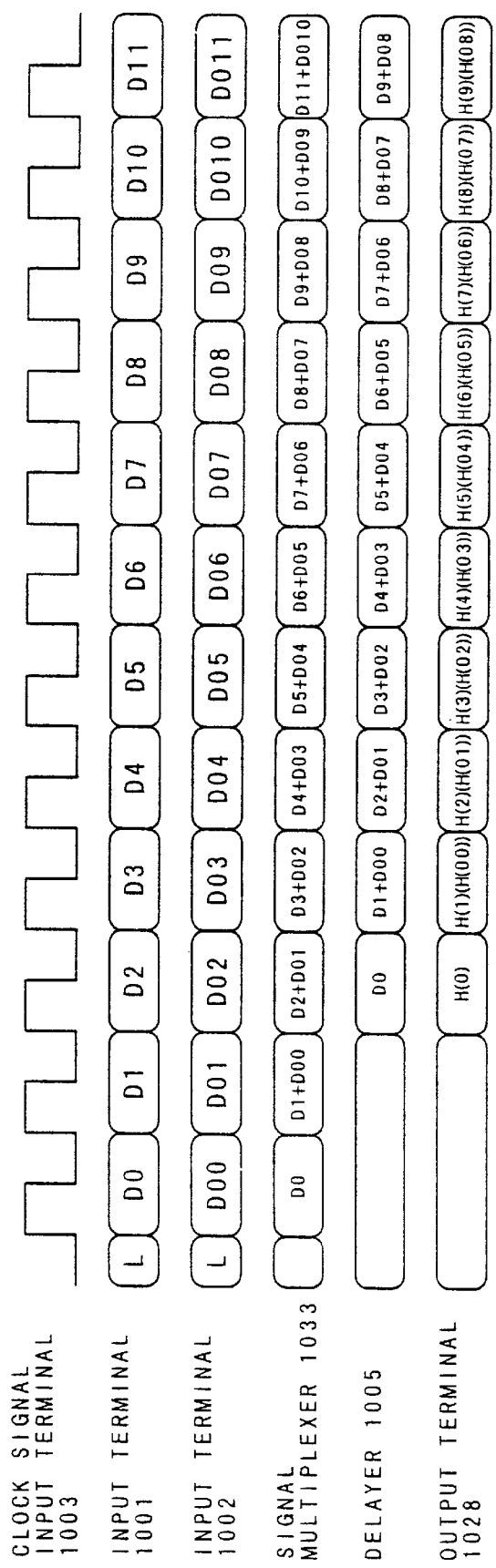
FIG. 15 is a timing chart for the matched filter unit in the ninth embodiment of the present invention.
Figure 16:
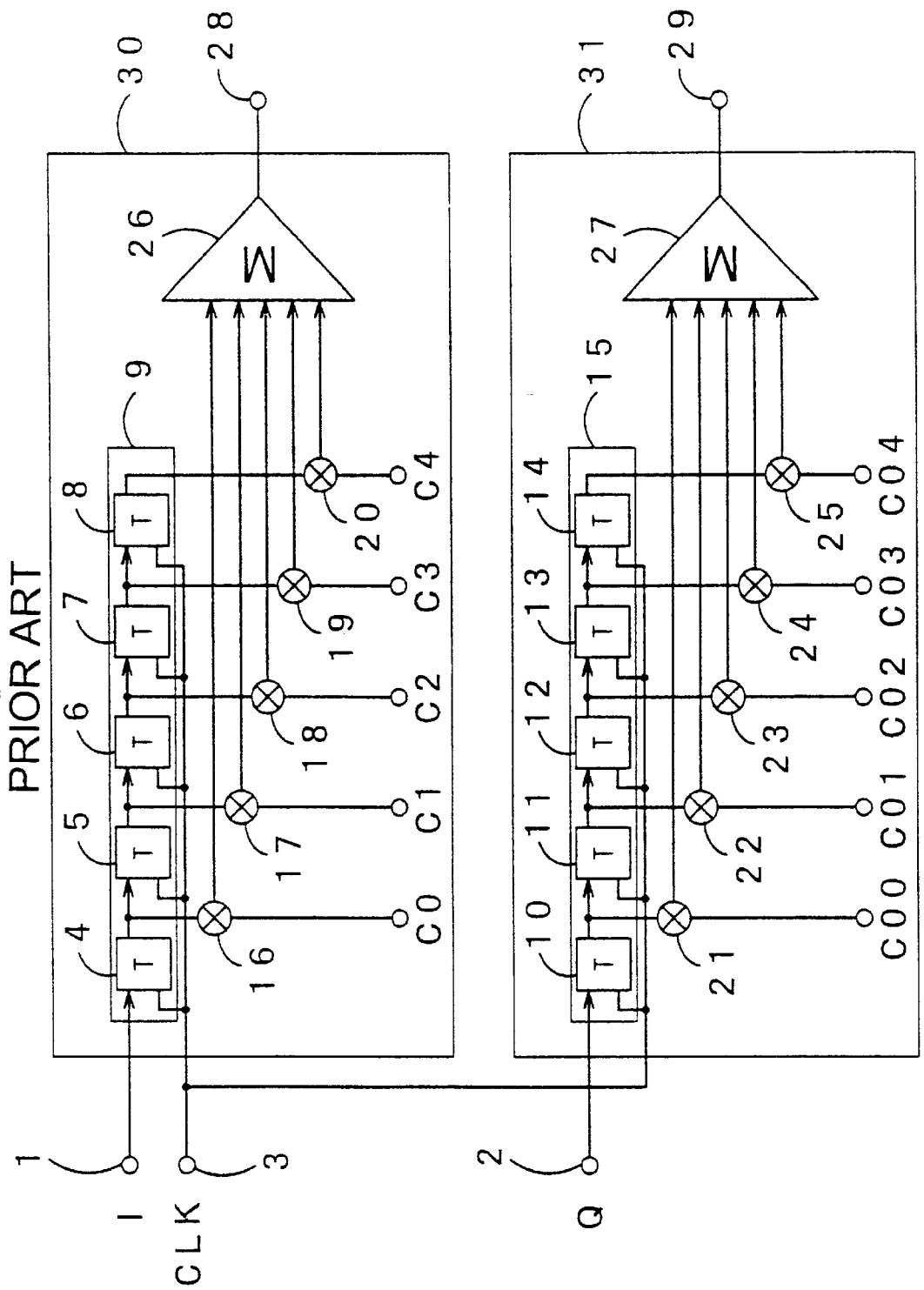
FIG. 16 is a block diagram for the matched filter unit in the first related art embodiment.
Figure 17:
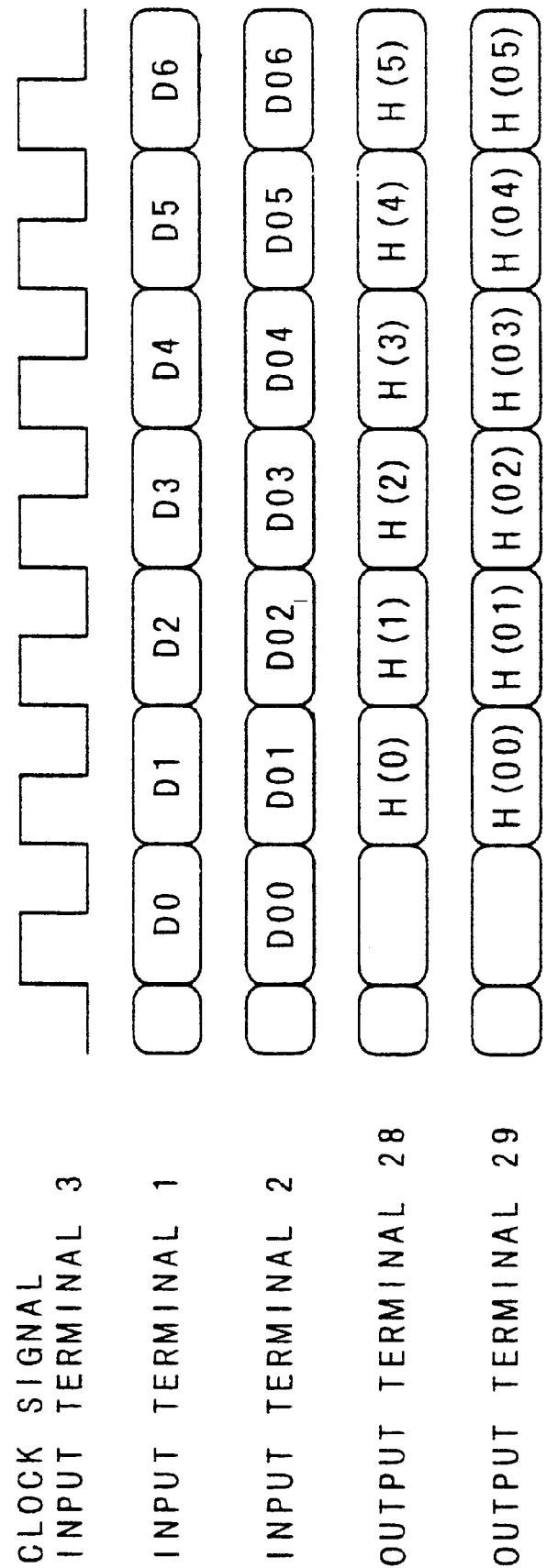
FIG. 17 is a timing chart for the matched filter unit in the first related art embodiment.

Hereunder, description will be made for a procedure of a back-diffusion computing processing performed in each of the multipliers 1016 to 1020, as well as in the adder 1026 with reference to the timing chart shown in FIG. 15.

In the initial state, all the signals output from the delay circuits 1004 to 1013 composing the shift register 1014 are set in the low level.

In the first operation state, if the first sampling data D0 of the digital signal I is entered to the input terminal 1001 and the first sampling data D00 of the digital signal Q is entered to the input terminal 1002 synchronously with a clock signal CLK, the phase changing circuit 1039 delays the phase of the digital signal Q by one clock from the phase of the digital signal I. Then, the signal multiplexing circuit 1033 multiplexes both sampling data D0 and low level. The multiplexed signal is then fetched into the first delay circuit 1004. After this, if the second sampling data D1 of the digital signal I is entered to the input terminal 1001 and the second sampling data D01 of the digital signal Q is entered to the input terminal 1002 synchronously with a clock signal CLK, the phase changing circuit 1039 delays the second sampling data D01 of the digital signal Q by one clock from the sampling data D1 of the digital signal I. Then, the signal multiplexing circuit 1033 multiplexes both the second sampling data D1 of the digital signal I and the first sampling data D00 of the digital signal Q and the multiplexed signal is fetched into the first delay circuit 1004. At this time, the multiplexed signal D0 of the first sampling data of the digital signal I and the low level is fetched into the second delay circuit 1005. The multiplier 1016 then multiplies the signal output from the delay circuit 1005 by the code value C0. Consequently, the multiplier 1016 outputs a signal indicating the value D0×C0.

In the second operation state, if the third sampling data D2 of the digital signal I is entered to the input terminal 1001 and the third sampling data D02 of the digital signal Q is entered to the input terminal 1002 synchronously with a clock signal CLK, the phase changing circuit 1039 (1033?) delays the third sampling data D02 of the digital signal Q by one clock from the third sampling data of the digital signal I. Then, the signal multiplexing circuit 1033 multiplexes the third sampling data D2 of the digital signal I and the second sampling data D01 of the digital signal Q. The multiplexed signal is then fetched into the first delay circuit 1004. At this time, the multiplexed signal D1+D00 of the second sampling data of the digital signal I and the first sampling data of the digital signal Q is fetched into the second delay circuit 1005, as well as the multiplexed signal D0 of the first sampling data of the digital signal I and the low level is fetched into the third delay circuit 1006. After this, if the fourth sampling data D3 of the digital signal I is entered to the input terminal 1001 and the fourth sampling data D03 of the digital signal Q is entered to the input terminal 1002 synchronously with a clock signal CLK, the phase changing circuit 1039 (1033?) delays the fourth sampling data D03 of the digital signal Q by one clock. Then, the signal multiplexing circuit 1033 multiplexes the fourth sampling data D3 of the digital signal I and the third sampling data D02 of the digital signal Q, and the multiplexed signal is then fetched into the first delay circuit 1004. At this time, the multiplexed signal D2+D01 of the third sampling data of the digital signal I and the second sampling data of the digital signal Q is fetched into the second delay circuit 1005, as well as the multiplexed signal D1+D00 of the second sampling data of the digital signal I and the first sampling data of the digital signal Q is fetched into the third delay circuit 1006 and the multiplexed signal D0 of the first sampling data of the digital signal I and the low level is fetched into the fourth delay circuit 1007. Consequently, the multiplier 1016 multiplies the signal output from the delay circuit 1005 by the code value C0 and the multiplier 1017 multiplies the signal output from the delay circuit 1007 by the code value C1. Consequently, the multiplier 1016 outputs a signal indicating the value (D2+D01)×C0 and the multiplier 1017 outputs a signal indicating the value D0×C1.

Hereafter, the same processings are repeated until the ninth sampling data D8 and D08 are entered to the input terminals 1001 and 1002 respectively.

And, if the tenth sampling data D9 and D09 of the digital signals I and Q are entered to the input terminals 1001 and 1002 synchronously with the clock signal CLK, each of the multiplexed signals of the first to tenth sampling data D0 to D9 and D00 to D09 is fetched into corresponding one of the delay circuits 1004 to 1013 respectively. Consequently, the multiplier 1016 outputs a result of multiplication indicating the value (D8+D07)×C0, the multiplier 1017 outputs a result of multiplication indicating the value (D6+D05)×C1, the multiplier 1018 outputs a result of multiplication indicating the value (D4+D03)×C2, the multiplier 1019 outputs a result of multiplication indicating the value (D2+D01)×C3, and the multiplier 1020 outputs a result of multiplication indicating the value D0×C4.

This completes all the necessary multiplications for finding a value of correlation between the back-diffusion code string C4C3C2C1C0 and each even-numbered data of the first 10 sampling data D0 to D9 of the digital signal I. As for the digital signal Q, since the signal Qt is delayed by one clock in the phase changing circuit 1039, when the eleventh sampling data D10 and D010 are entered to the input terminals 1001 and 1002 respectively, a necessary multiplication is performed to find a value of correlation between the back-diffusion code string C4C3C2C1C0 and each even-numbered data of the first 10 sampling data D00 to D09 of the digital signal Q. After this, the adder 1026 adds results of multiplication entered from each of the multipliers and outputs correlation results H (7) and H (07) with respect to the inputs of the digital signals I and Q from the output terminal 1028 respectively.

According to this embodiment as described above, the correlation is eliminated from between the digital signals I and Q that are diffusion-modulated with the same code value by changing the phase of either of those signals, then those non-correlative signals are multiplexed and the multiplexed signal is computed for back-diffusion. It is thus possible to use the same delay circuits 1004 to 1013, the same multipliers 1016 to 1020, and the same adder 1026 for the back-diffusion computing processing for both digital signals I and Q. And accordingly, the circuitry size of the matched filter unit can be reduced significantly thereby to satisfy the miniaturizing, lower manufacturing cost, and power saving prerequisites.

And, although only two digital signals I and Q are used in this embodiment, it is also possible to use more signals that are diffusion-modulated with the same code value and entered from three or more channels in the same configuration.

Furthermore, although the sixth embodiment shown in FIG. 8 is composed so as to perform the correlation detecting method in the fifth embodiment and the matched filter unit receives digital signals I and Q generated by sampling analog signals with a 4.096 MHz sampling frequency, the digital signals I and Q entered to the matched filter unit in this embodiment are generated by sampling analog signals with a 8.192 MHz frequency (double the sampling frequency in the fourth embodiment). Consequently, the shift register 1014 shown in FIG. 14 uses delay circuits disposed in stages double as many as those of the shift register 709 shown in FIG. 8. Then, the signal from each second delay circuit is entered to the corresponding multiplier. In the same way, digital signals I and Q may also be over-sampled with a frequency clock three times or over the above one, of course.

What is claimed is:

1. A method for detecting a value of correlation between each of a plurality of digital signals and each of a plurality of digital code strings, including steps of:
   multiplexing a plurality of said digital signals;
   storing a multiplexed signal of a plurality of said digital signals;
   switching a plurality of said digital code strings in a time-dividing manner; and
   performing a back-diffusion computing processing for said stored multiplexed signal and for each of said digital code strings switched in a time-dividing manner.

2. A method for detecting a value of correlation between each of a plurality of digital signals and each of a plurality of digital code strings, including steps of:
   changing a phase of a plurality of said digital signals;
   multiplexing a plurality of said digital signals whose phase is changed;
   storing a multiplexed signal of a plurality of said digital signals; and
   performing a back-diffusion computing processing for said stored multiplexed signal and for each of a plurality of said digital code strings.

3. A matched filter unit for finding a value of correlation between each of a plurality of said digital signals synchronized with a clock and each of a plurality of said digital code strings, each consisting of M digital codes (M: plural), comprising
   a circuit for multiplexing a plurality of said digital signals;
   a storage circuit including delay circuits disposed in M stages (M: plural) and used for entering a signal output from said signal multiplexing circuit to first stage delay circuit, then shifting said signal to subsequent delay circuits sequentially in synchronization with said clock signal;
   a circuit for switching a plurality of said digital code strings to output in a time-dividing manner;
   M multipliers (M: plural), each used for multiplying a signal output from each of said delay circuits by each of signal codes of a digital code string output from said digital code string switching circuit; and
   an adder for adding results of multiplication from said M multipliers to find a value of said correlation.

4. A matched filter unit for finding a value of correlation between each of a plurality of digital signals synchronized with a clock and a digital code string consisting of M digital codes (M: plural), comprising:
   a circuit for changing a phase of a plurality of said digital signals;
   a circuit for multiplexing a plurality of said digital signals whose phase is changed by said phase changing circuit;
   a storage circuit including delay circuits disposed in M stages (M: plural) and used for entering a signal output from said signal multiplexing circuit to a first stage delay circuit, then shifting said signal to subsequent delay circuits sequentially in synchronization with said clock signal;
   M multipliers (M: plural), each used for multiplying a signal output from each of said delay circuits by each digital code of said digital code string;

an adder for adding results of multiplication from said M multipliers thereby to find a value of said correlation.

5. A matched filter unit for finding each of a plurality of digital signals over-sampled with second clock having a frequency m times (m: a plural number) that of first clock and each of a plurality of digital code strings, each consisting of M digital codes (M: plural), comprising a circuit for multiplexing a plurality of said digital signals;

a storage circuit including delay circuits disposed in m×M stages and used for entering a signal output from said signal multiplexing circuit to first stage delay circuit, then shifting said signal to subsequent delay circuits sequentially in synchronization with said second clock;

a circuit for switching a plurality of said digital code strings to output in a time-dividing manner;

M multipliers (M: plural), each used for multiplying a signal output from every m-th stage delay circuit of said delay circuits disposed in m×M stages by each digital code of a digital code string output from said digital code string switching circuit; and an adder for adding results of multiplication from said M multipliers to find a value of said correlation.

6. A matched filter unit for finding a value of correlation between each of a plurality of digital signals over-sampled with second clock having a frequency m times (m: plural) that of first clock and a digital code string consisting of M digital codes (M: plural), comprising a circuit for changing a phase of a plurality of said digital signals;

a storage circuit including delay circuits disposed in m×M stages and used for entering a signal output from said signal multiplexing circuit to first stage delay circuit, then shifting said signal to subsequent delay circuits sequentially in synchronization with said second clock;

M multipliers (M: plural), each used for multiplying a signal output from every m-th stage delay circuit of said delay circuits disposed in m×M stages by each digital code of said digital code string; and an adder for adding results of multiplication from said M multipliers to find a value of said correlation.

* * * * *